(12) United States Patent
Yeo et al.

(10) Patent No.: US 10,043,873 B2
(45) Date of Patent: Aug. 7, 2018

(54) SEMICONDUCTOR DEVICE AND METHOD OF MANUFACTURING THE SAME

(71) Applicant: SAMSUNG ELECTRONICS CO., LTD., Suwon-si, Gyeonggi-do (KR)

(72) Inventors: Kyoung Hwan Yeo, Seoul (KR); Seonguk Park, Suwon-si (KR); Seungjae Lee, Hwaseong-si (KR); Doyoung Choi, Hwaseong-si (KR); Sunhom Steve Paak, Seoul (KR); Tae Eung Yoon, Seoul (KR); Dongho Cha, Seongnam-si (KR); Ruiyi Chen, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/060,174

(22) Filed: Mar. 3, 2016

(65) Prior Publication Data
US 2016/0308008 A1   Oct. 20, 2016

(30) Foreign Application Priority Data
Apr. 14, 2015 (KR) ........................ 10-2015-0052553

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 29/40 | (2006.01) | |
| H01L 29/66 | (2006.01) | |
| H01L 27/11 | (2006.01) | |
| H01L 29/417 | (2006.01) | |
| H01L 29/78 | (2006.01) | |

(52) U.S. Cl.
CPC ...... H01L 29/408 (2013.01); H01L 29/66545 (2013.01); H01L 29/66795 (2013.01); H01L 29/785 (2013.01); H01L 27/1104 (2013.01); H01L 29/41791 (2013.01); H01L 29/7848 (2013.01)

(58) Field of Classification Search
CPC ............ H01L 29/66795; H01L 29/785; H01L 29/66545; H01L 29/7848; H01L 29/41791; H01L 27/1104; H01L 29/408
USPC ........................................................ 257/411
See application file for complete search history.

(56) References Cited

U.S. PATENT DOCUMENTS 6,369,423 B2    4/2002  Ohiwa et al.
8,906,754 B2   12/2014  Pham et al.
(Continued)

FOREIGN PATENT DOCUMENTS

JP       2002141500       5/2002

*Primary Examiner* — Thien F Tran
(74) *Attorney, Agent, or Firm* — F. Chau & Associates, LLC

(57) ABSTRACT

Provided is a semiconductor device with a field effect transistor. The semiconductor device includes a substrate, an active pattern on the substrate, a gate electrode crossing the active pattern and a capping structure on the gate electrode. The capping structure includes first and second capping patterns that are sequentially stacked on the gate electrode. The second capping pattern completely covers a top surface of the first capping pattern, and a dielectric constant of the second capping pattern is greater than that of the first capping pattern.

19 Claims, 33 Drawing Sheets

(56) References Cited

U.S. PATENT DOCUMENTS

| | | | |
|---|---|---|---|
| 2002/0070398 A1* | 6/2002 | Lee | H01L 21/7688 257/296 |
| 2005/0104096 A1* | 5/2005 | Lee | H01L 21/82384 257/288 |
| 2006/0118876 A1* | 6/2006 | Lee | H01L 29/66795 257/365 |
| 2012/0018739 A1 | 1/2012 | Liang et al. | |
| 2013/0309857 A1* | 11/2013 | Koburger III | H01L 27/088 438/591 |
| 2014/0367788 A1 | 12/2014 | Xie et al. | |
| 2015/0021683 A1 | 1/2015 | Xie et al. | |
| 2015/0035086 A1 | 2/2015 | Xie et al. | |
| 2015/0041868 A1 | 2/2015 | Cheng et al. | |
| 2015/0214220 A1* | 7/2015 | Seo | H01L 27/088 257/392 |
| 2016/0126326 A1 | 5/2016 | Park et al. | |

* cited by examiner

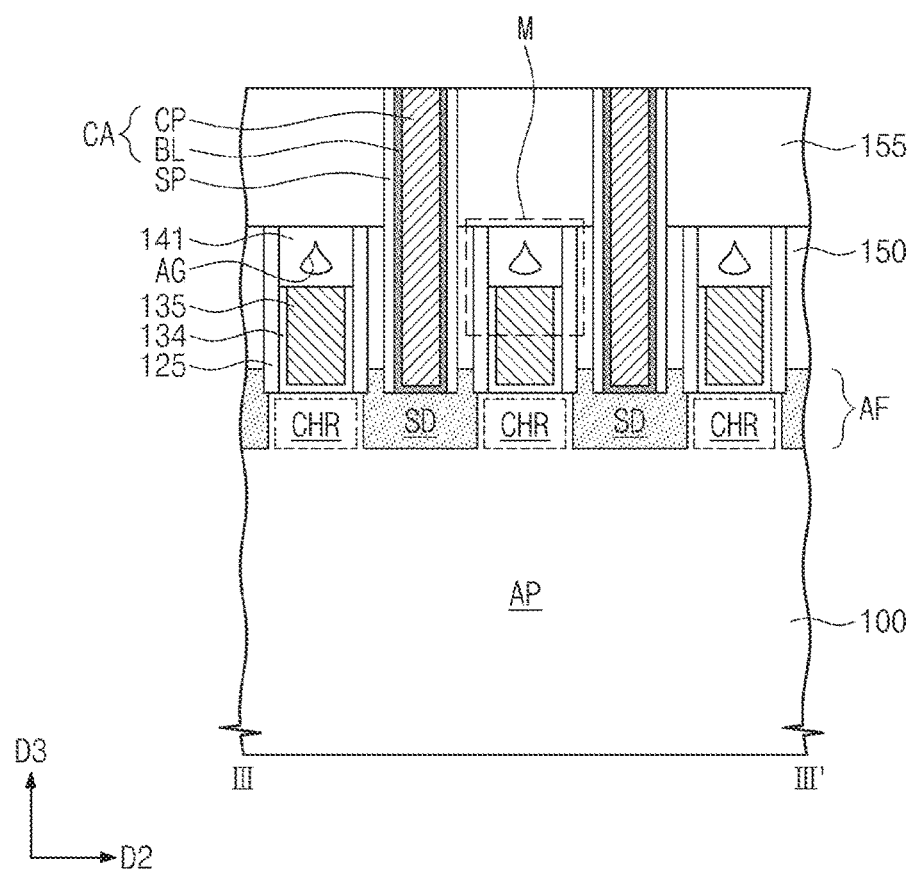

SEMICONDUCTOR DEVICE AND METHOD OF MANUFACTURING THE SAME

CROSS-REFERENCE TO RELATED APPLICATIONS

This application claims priority under 35 U.S.C. § 119(a) to Korean Patent Application No. 10-2015-0052553, filed on Apr. 14, 2015, in the Korean Intellectual Property Office, the disclosure of which is incorporated by reference in its entirety herein.

BACKGROUND

1. Technical Field

The inventive concept relates to a semiconductor device and a method of manufacturing the same, and more particularly, to a semiconductor device including a field effect transistor and a method of manufacturing the same.

2. Discussion of Related Art

Due to their small-sized, multifunctional and/or low-cost characteristics, semiconductor devices are widely used in the electronics industry. The semiconductor devices may be classified into a memory device for storing logic data, a logic device for processing the logic data and a hybrid device including both memory and logic elements. To meet the increased demand for electronic devices that operate at high speeds and which require a low amount of power, it is necessary to realize semiconductor devices with high reliability, high performance, and which provide multiple functions. To satisfy these technical requirements, it is necessary to increase the complexity and integration density of semiconductor devices.

SUMMARY

According to an exemplary embodiment of the inventive concept, a semiconductor device includes a substrate, an active pattern disposed on the substrate, a gate electrode crossing the active pattern and a capping structure disposed on the gate electrode. The capping structure includes first and second capping patterns that are sequentially stacked on the gate electrode. The second capping pattern completely covers a top surface of the first capping pattern. A dielectric constant of the second capping pattern is greater than that of the first capping pattern.

In an exemplary embodiment, sidewalls of the first and second capping patterns are coplanar with each other.

In an exemplary embodiment, the first and second capping patterns have flat top surfaces.

In an exemplary embodiment, a width of the first capping pattern is substantially the same as that of the second capping pattern.

In an exemplary embodiment, the first capping pattern includes SiCN or SiOCN, and the second capping pattern includes SiN.

In an exemplary embodiment, the semiconductor device further includes gate spacers disposed on opposite sidewalls of the gate electrode, where top surfaces of the gate spacers are coplanar with a top surface of the second capping pattern.

In an exemplary embodiment, the semiconductor device further includes source/drain regions formed on the active pattern at both sides of the gate electrode, and contacts disposed at both sides of the gate electrode to be electrically connected to the source/drain regions.

In an exemplary embodiment, the top surface of the second capping pattern is in contact with at least one of the contacts.

In an exemplary embodiment, the semiconductor device further includes a device isolation layer defining the active pattern on the substrate, where an upper portion of the active pattern protrudes from a lower portion of the active pattern located between parts of the device isolation layer, and the gate electrode crosses the upper portion of the active pattern and extends on the device isolation layer.

In an exemplary embodiment, the semiconductor device further includes a gate dielectric layer disposed between the gate electrode and the active pattern, where the gate dielectric layer extends along opposite sidewalls of the gate electrode and contacts a bottom surface of the first capping pattern.

In an exemplary embodiment, the active pattern extends in a first direction parallel to a top surface of the substrate, where the gate electrode and the capping structure extend in a second direction crossing the first direction, and when viewed in a plan view, the gate electrode overlaps the capping structure.

In an exemplary embodiment, the first capping pattern includes an internal air gap.

In an exemplary embodiment, a lower width of the air gap is greater than an upper width of the air gap.

In an exemplary embodiment, the air gap extends in a direction parallel to a top surface of the substrate along the gate electrode.

According to an exemplary embodiment of the inventive concept, a semiconductor device includes a substrate having an active pattern, a gate electrode crossing the active pattern, and a first capping pattern covering a top surface of the gate electrode. The first capping pattern includes an internal air gap, and a lower width of the air gap is greater than an upper width of the sir gap.

In an exemplary embodiment, when viewed in a plan view, the air gap is located at a center of the first capping pattern.

In an exemplary embodiment, the semiconductor device further includes a second capping pattern covering a top surface of the first capping pattern, where a dielectric constant of the second capping pattern is greater than that of the first capping pattern.

In an exemplary embodiment, the semiconductor device further includes gate spacers on opposite sidewalls of the gate electrode, where the gate spacers cover opposite sidewalls of the first and second capping pattern, and a top surface of the second capping pattern is coplanar with top surfaces of the gate spacers.

In an exemplary embodiment, the active pattern extends in a first direction parallel to a top surface of the substrate, where the gate electrode and the first capping pattern extend in a second direction crossing the first direction, and an air gap which is located inside of the first capping pattern, extends in the second direction along the gate electrode.

According to an exemplary embodiment of the inventive concept, a semiconductor device includes a substrate having an active pattern, a device isolation layer defining the active pattern, a gate electrode crossing the active pattern and a first capping pattern covering a top surface of the gate electrode, where an upper portion of the active pattern protrudes from a lower portion of the active pattern located between parts of the active isolation layer, the first capping pattern includes an internal air gap formed, and a lower width of the air gap is greater than an upper width of the air gap.

According to an exemplary embodiment of the inventive concept, a semiconductor device includes a semiconductor substrate having a plurality of active patterns, a gate electrode crossing the active patterns, a first ceramic layer located on the gate electrode, and a second ceramic layer located on the first ceramic layer. A dielectric constant of the second ceramic layer is greater than that of the first ceramic layer.

In an embodiment, the second ceramic layer completely covers a top surface of the first ceramic layer.

In an embodiment, the first ceramic layer is SiCN or SiOCN, and the second ceramic layer is SiN.

In an embodiment, an air gap is located within the first ceramic layer.

In an embodiment, the air gap has a first part with a first width and a second part with a second width, where the second part is closer to the substrate than the first part and the second width is larger than the first width.

BRIEF DESCRIPTION OF THE DRAWINGS

Exemplary embodiments of the inventive concept will become more apparent from the following description with reference to the accompanying drawings, wherein

FIGS. 5A to 5C are cross-sectional views illustrating a semiconductor device according to exemplary embodiments of the inventive concept;

FIGS. 7A to 13A and FIGS. 7B to 13B are cross-sectional views illustrating a method of manufacturing a semiconductor device according to exemplary embodiments of the inventive concept;

DETAILED DESCRIPTION OF THE EXEMPLARY EMBODIMENTS

Figure 1:
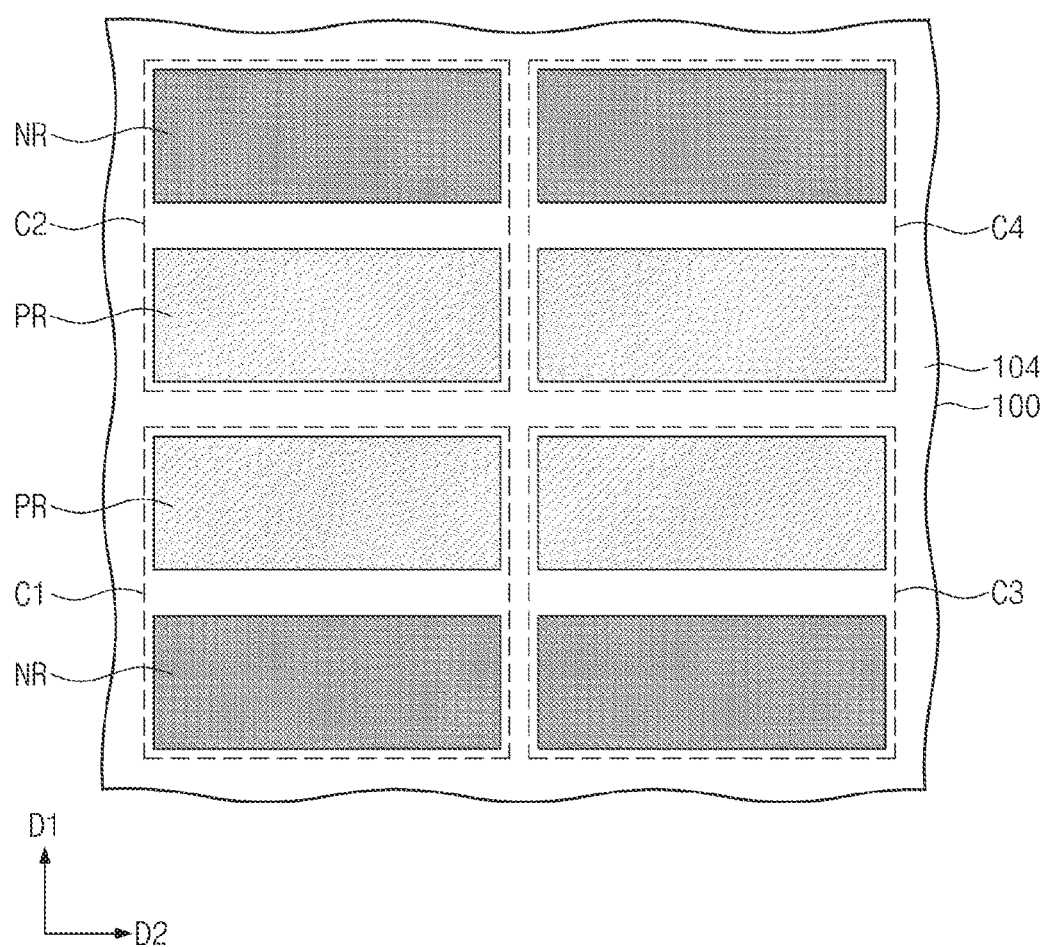
FIG. 1 is a plan view of a semiconductor device according to exemplary embodiments of the inventive concept.

The inventive concepts will now be described more fully with reference to the accompanying drawings, in which exemplary embodiments thereof are shown. Exemplary embodiments of the inventive concepts may, however, be embodied in many different forms and should not be construed as being limited to the embodiments set forth herein. Rather, these embodiments are provided so that this disclosure will be thorough and complete and fully convey the inventive concepts to those of ordinary skill in the art. Like reference numerals in the drawings denote like elements, and thus their description will be omitted.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise. Example embodiments of the inventive concepts are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are and are not intended to limit the scope of the exemplary embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view of a semiconductor device according to exemplary embodiments of the inventive concept.

Referring to FIG. 1, the semiconductor device according to exemplary embodiments of the inventive concept includes a plurality of logic cells C1, C2, C3 and C4 provided on a substrate 100. In an embodiment, the substrate 100 is formed of a semiconductor material. Each of the logic cells C1, C2, C3 and C4 includes a plurality of transistors. As an example, the semiconductor device includes a first logic cell C1, a second logic cell C2 spaced apart from the first logic cell C1 in a first direction D1, a third logic cell C3 spaced apart from the first logic cell C1 in a second direction D2 perpendicular to the first direction D1, and a fourth logic cell C4 spaced apart from the second logic cell C2 in the second direction D2. Each of the logic cells C1, C2, C3 and C4 may include active regions separated from each other by a device isolation layer 104. In an embodiment, each of the logic cells C1, C2, C3 and C4 include a PMOSFET region PR and an NMOSFET region NR separated from each other by the device isolation layer 104.

As an example, the PMOSFET region PR and the NMOSFET region NR are spaced apart from each other in the first direction D1. In an embodiment, the PMOSFET region PR of the first logic cell C1 is adjacent to the PMOSFET region PR of the second logic cell C2 in the first direction D1. In the description below, a logic cell may be referred to as a unit configured to perform a logical operation, and the first logic cell C1 will be described as an example of such a logic cell. The number of logic cells may be variously changed from that illustrated in the drawings.

Figure 2:
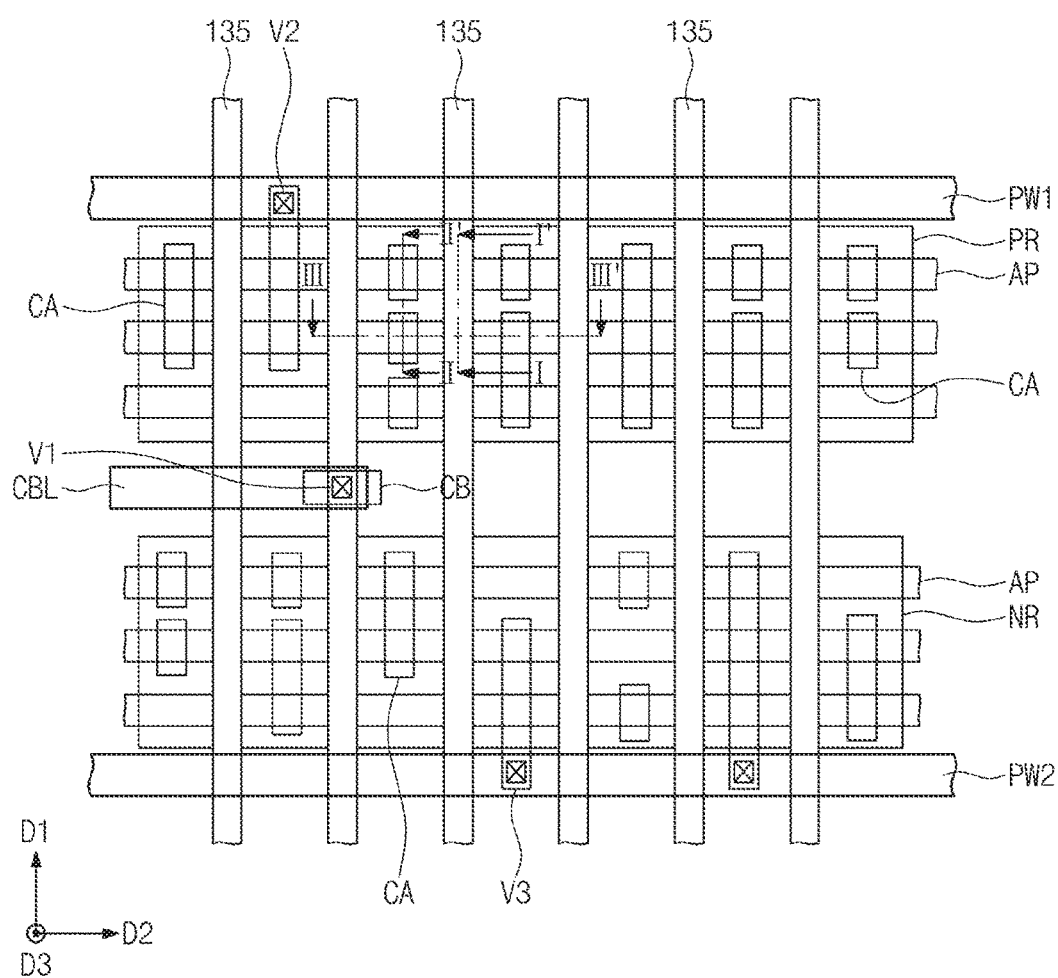
FIG. 2 is a plan view of a first logic cell of FIG. 1, which is illustrated to provide a description of a semiconductor device according to exemplary embodiments of the inventive concept.
Figure 3A:
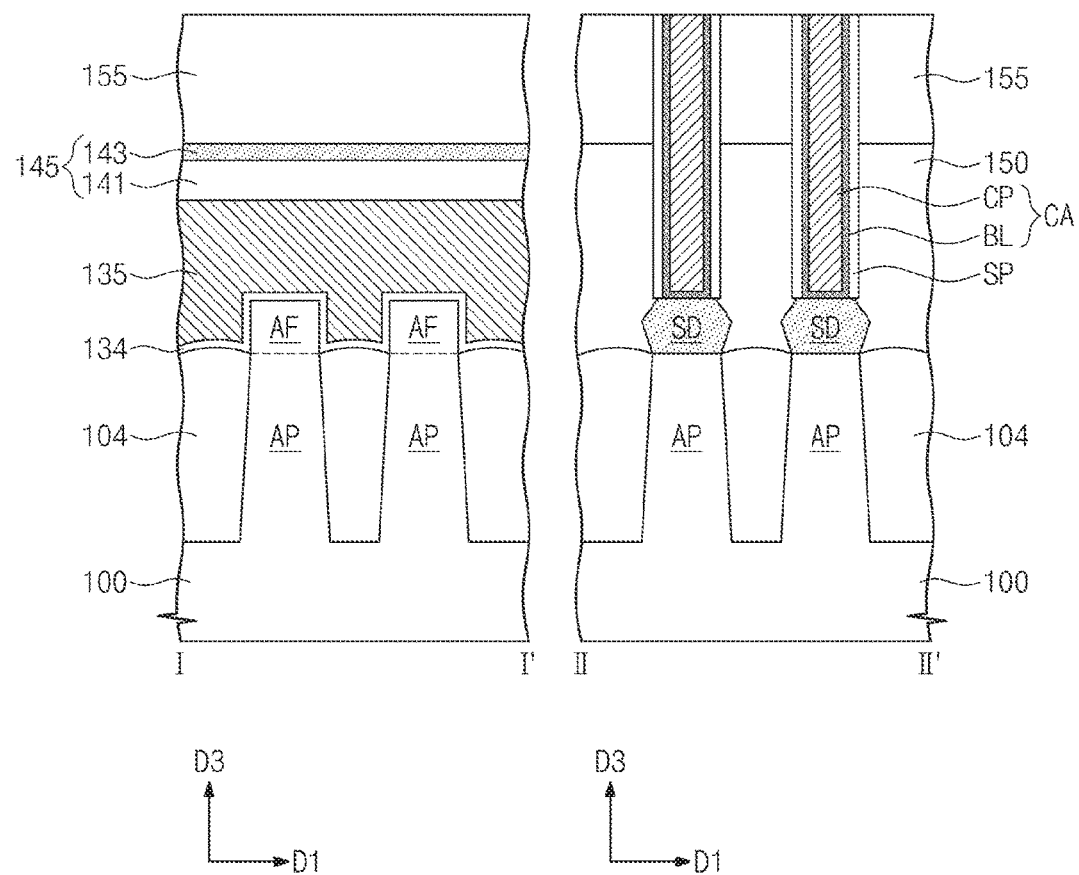
FIG. 3A is a cross-sectional view taken along lines I-I' and II-II' of FIG. 2.
Figure 3B:
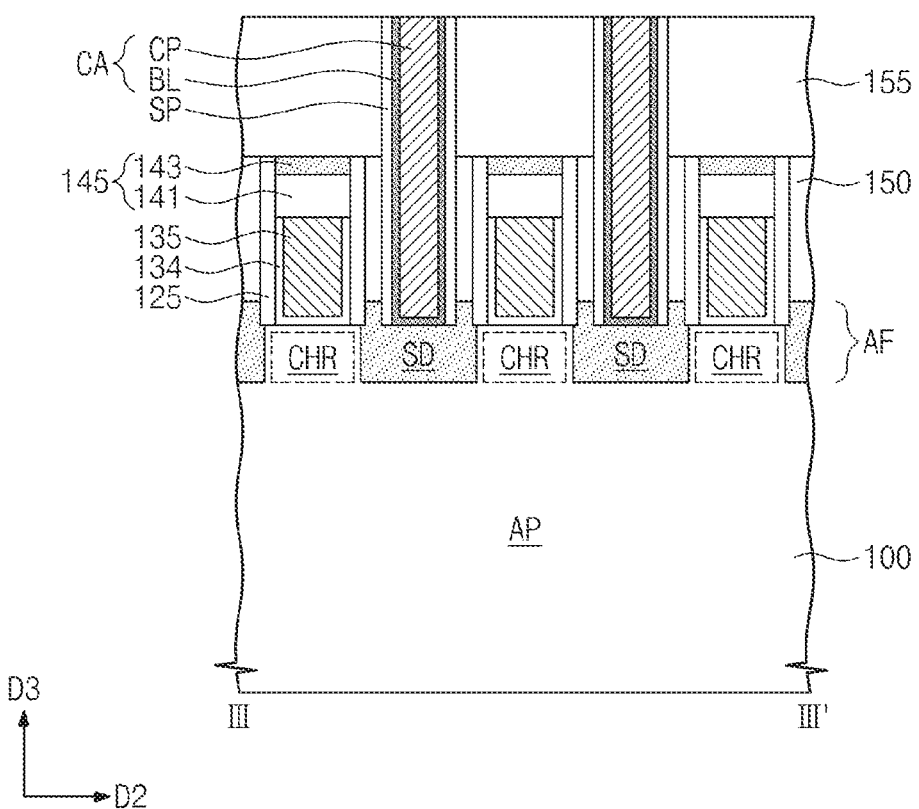
FIG. 3B is a cross-sectional view taken along line III-III' of FIG. 2.

FIG. 2 is a plan view illustrating a semiconductor device according to exemplary embodiments of the inventive concept. For example, FIG. 2 is a plan view of the first logic cell C1 of the FIG. 1. Hereinafter, various embodiments of the inventive concept will be described with reference to the first logic cell C1 of the FIG. 1, but other logic cells may be substantially the same as or similar to the first logic cell C1. FIG. 3A is a cross-sectional view taken along lines I-I' and II-II' of FIG. 2. FIG. 3B is a cross-sectional view taken along line III-III' of FIG. 2.

Referring to FIGS. 2, 3A and 3B, the device isolation layer 104 is disposed in the substrate 100 to define the PMOSFET and NMOSFET regions PR and NR. The device isolation layer 104 may be formed in an upper portion of the substrate 100. For example, the device isolation layer 104 is illustrated in FIG. 3A as being disposed on an upper surface of the substrate 100. As an example, the device isolation layer 104 may include an insulating material such as a silicon oxide layer.

In an embodiment, the PMOSFET and NMOSFET regions PR and NR are spaced apart from each other in the first direction D1 parallel to a top surface of the substrate 100 with the device isolation layer 104 interposed therebetween. Although each of the PMOSFET and NMOSFET regions PR and NR in a given logic cell is illustrated in FIG. 1 as a single region, the PMOSFET and NMOSFET regions PR and NR may be formed to include a plurality of regions which are separated from each other by the device isolation layer 104.

In an embodiment, a plurality of active patterns AP are provided on the PMOSFET and NMOSFET regions PR and NR to extend in the second direction D2 perpendicular to the first direction D1. The active patterns AP may be arranged along the first direction D1. The active patterns AP have a first conductivity type. The device isolation layer 104 may define the active patterns AP. Although the number of the active patterns AP provided respectively on the PMOSFET and NMOSFET regions PR and NR may be shown to be three, exemplary embodiments of the inventive concept are not limited thereto.

In an embodiment, the active patterns AP are located between parts of the device isolation layers 104 and active fins AF protrude from upper surfaces of the active patterns AP. More specifically, each of the active fins AF may protrude in the third direction D3 perpendicular to a top surface of the substrate 100 from the active pattern AP. As shown in FIG. 3B, in an exemplary embodiment, each of the active fins AF include source/drain regions SD and a channel region CHR interposed between the source/drain regions SD. A source/drain region SD may include a source electrode for a transistor or a drain electrode for the transistor.

According to exemplary embodiments of the inventive concept, gate electrodes 135 are disposed on the substrate 100 to cross the active patterns AP. In an embodiment, the gate electrodes 135 overlap with the channel regions CHR of the active fins AF, respectively. The gate electrodes 135 may be a line shape. The gate electrodes 135 may extend in the first direction D1 and cross the active fins AF, which protrude from the active patterns, respectively.

In an embodiment, gate spacers 125 are disposed on opposite sidewalls of each of the gate electrodes 135. The gate spacers 125 may extend in the first direction D1 along the gate electrodes 135. In an embodiment, top surfaces of the gate spacers 125 are positioned at a higher level than those of the gate electrodes 135. In an embodiment, the top surfaces of the gate spacers 125 are coplanar with top surfaces of a first interlayer insulating layer 150 and second capping patterns 143. The gate spacers 125 may include at least one of silicon oxide ($SiO_2$), silicon carbide nitride (SiCN), silicon carbide oxynitride (SiCON) and silicon nitride (SiN). The gate spacers 125 may include a multi-layer including at least one of silicon oxide ($SiO_2$), silicon carbide nitride (SiCN), silicon carbide oxynitride (SiCON) and silicon nitride (SiN).

In an exemplary embodiment, a gate insulating layer 134 is disposed between the gate electrode 135 and the substrate 100 and between the gate electrode 135 and the gate spacer 125. In an exemplary embodiment, the gate insulating layer 134 extends along a bottom surface of the gate electrode 135. Thus, the gate insulating layer 134 may cover a top surface and sidewalls of the channel region CHR. In an embodiment, the gate insulating layer 134 horizontally extends from the active fins AF and partially covers top surfaces of the device isolation layers 104. Thus, some portions of top surfaces of the device isolation layers 104 are not covered by the gate insulating layer 134 but may be covered by the first interlayer insulating layer 150.

The gate insulating layer 134 may include a high-k dielectric material. A high-k dielectric material refers to a material with a high dielectric constant k. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide and lead zinc niobate.

In an embodiment, capping structures 145 are disposed on the gate electrodes 135, respectively. The capping structures 145 may extend in the first direction D1 along the gate electrodes 135. That is, when viewed in a plan view, the gate electrodes 135 may overlap with the capping structures 145. In an embodiment, a capping structure 145 includes a first capping pattern 141 and a second capping pattern 143 sequentially stacked on the gate electrodes 135.

In an embodiment, the first capping pattern 141 completely covers a top surface of the gate electrode 135 and extends in the first direction D1. In an embodiment, the first capping pattern 141 has a flat top surface and opposite sidewalls of the first capping pattern 141 directly contact the gate spacers 125. In an embodiment, a bottom surface of the first capping pattern 141 directly contacts a top surface of the gate electrode 135. In an embodiment, the gate insulating layer 134 extends along the opposite sidewalls of the gate electrode 135 and directly contacts the bottom surface of the first capping pattern 141.

The second capping pattern 143 may completely cover the top surface of the first capping pattern 141 and may extend in the first direction D1. In an embodiment, a bottom surface of the second capping pattern 143 directly contacts the top surface of the first capping pattern 141. The second capping pattern 143 may have a flat top surface. The top surface of the second capping pattern 143 may be coplanar with the top surface of the first interlayer insulating layer 150 and the top surfaces of the gate spacers 125. In an embodiment, opposite sidewalls of the second capping pattern 143 directly contact the gate spacers 125. The opposite sidewalls of the second capping pattern 143 may be aligned with the opposite sidewalls of the first capping pattern 141. Thus, the sidewalls of the first and second capping patterns 143 and 141 may be coplanar with each other. In an embodiment, the first and second capping patterns 143 and 141 have substantially the same width as each other.

In an embodiment, the capping structures 145 includes a material having an etch selectivity with respect to first and second interlayer insulating layers 150 and 155. For example, each of the first and second capping patterns 143 and 141 may include at least one of silicon oxynitride (SiON), silicon carbide nitride (SiCN), silicon carbide oxynitride (SiCON) and silicon nitride (SiN). In an embodiment, the capping structures 145 are made of a material that is capable of being etched a higher rate than the first and second interlayer insulating layers 150 and 155. In an embodiment, the capping structures 145 are made of a technical ceramic.

In general, a high-k dielectric material has a relatively high etching resistance to an etchant. In an exemplary embodiment of the inventive concept, when contacts CA are formed on the substrate, the second capping pattern 143 protects the gate electrode 135 from etching damage. Thus, in an exemplary embodiment, the second capping pattern 143 includes a material whose dielectric constant is higher than that of the first capping pattern 141. For example, the second capping pattern 143 may include silicon nitride (SiN) whose dielectric constant is higher than that of silicon carbide nitride (SiCN) and silicon carbide oxynitride (SiCON). The first capping pattern 141 may include silicon carbide nitride (SiCN) or silicon carbide oxynitride (SiCON). In an embodiment, the first capping pattern 141 is a compound that includes carbon or carbon and oxygen, in addition to nitrogen and silicon. In an embodiment, the dielectric constant of the second capping pattern 143 is twice or at least twice that of the first capping pattern 141.

The second capping pattern 143 may effectively protect an upper portion of the gate electrode 135 from over-etching during the forming of contacts onto the source/drain regions, because the second capping pattern 143 includes the relatively high-k dielectric material. Thus, the contacts CA may be effectively self-aligned with respect to a contact region without the risk of a short occurring between the contacts CA and the gate electrodes 135. In addition, a parasitic capacitance may be reduced between the gate electrode 135 and the capping structure 145, because the first capping pattern 141 includes the relatively low dielectric constant material. Thus, RC-delay of the semiconductor device may be improved and minimized.

In some embodiments of the inventive concept, each of the capping structures 145 include three or more capping patterns which are sequentially stacked on the gate electrode 135. As described above, the inventive concept is not limited to only the first and second capping patterns 141 and 143.

In an embodiment, the source/drain regions SD are provided in the active fins AF at both sides of each of the gate electrodes 135. The source/drain regions SD may include epitaxial patterns formed by epitaxial growth from the active patterns AP. When viewed in a cross-sectional view along the second direction D2, a top surface of the channel region CHR may be positioned at a higher level than a bottom surface of the source/drain regions SD. A top surface of the source/drain regions SD may be positioned at the same or higher level than the top surface of the channel region CHR.

In an embodiment, the source/drain regions SD include a semiconductor element different from the substrate 100. For example, the source/drain regions SD include a semiconductor element whose lattice constant is greater or smaller than that of the substrate 100. In this case, compressive stress or tensile stress may be created in the channel region CHR because the source/drain regions SD includes the semiconductor element different from the substrate 100. As an example, when the substrate 100 is a silicon substrate, the source/drain regions may include silicon-germanium (SiGe) or germanium (Ge). In this case, the compressive stress may be created in the channel region CHR, and a field effect transistor with the source/drain regions SD may be a PMOSFET. In another example, when the substrate 100 is a silicon substrate, the source/drain regions may include silicon carbide (SiC). In this case, the tensile stress may be created in the channel region CHR, and a field effect transistor with the source/drain regions SD may be an NMOSFET. A mobility of carriers in the channel regions CHR may be improved by introducing the compressive or tensile stress in the channel regions when the field effect transistor is operated. In an embodiment, the source/drain regions SD have a second conductivity type different from the active pattern AP.

In an embodiment, a first interlayer insulating layer 150 is disposed on the substrate 100. In an embodiment, the first interlayer insulating layer 150 covers the opposite sidewalls of the gate spacers 125 and the source/drain regions SD. In an embodiment, the top surface of the first interlayer insulating layer 150 is substantially coplanar with the top surface of the capping structure 145 and the top surface of the gate spacers. In an embodiment, a second interlayer insulating layer 155 covering the capping structures 145 is disposed on the first interlayer insulating layer 150

In an embodiment, contacts CA are disposed at the both sides of the gate electrodes 135 through the first and second interlayer insulating layers 150 and 155, and are electrically connected to the source/drain regions SD. For example, the contacts CA penetrate through the first and second interlayer insulating layers 150 and 155. One of the contacts CA may be connected to one source/drain region SD, or may be connected to a plurality of the source/drain regions SD, but it is not limited thereto. In an embodiment, each of the contacts CA includes a conductive pillar CP and a barrier layer BL surrounding the conductive pillar CP. In an embodiment, the barrier layer BL covers sidewalls and a bottom surface of the conductive pillar CP. The conductive pillar CP may include metal such as tungsten. The barrier layer BL may include metal nitride such as titanium or titanium nitride (TiN).

In an exemplary embodiment, contact spacers SP are interposed between the contacts CA and the first and second interlayer insulating layer 150 and 155. In an embodiment, each of the contact spacers SP surround the sidewalls of the contact CA. The contact spacers SP may include at least one of silicon oxide (SiO$_2$), silicon carbide nitride (SiCN), silicon carbide oxynitride (SiCON) and silicon nitride (SiN). The contact spacers SP may prevent electrical shorts between the contacts CA and the gate electrodes 135. In an embodiment, the contact spacers SP are omitted.

In exemplary embodiments, although not shown, silicide layers (not shown) are interposed between the source/drain regions SD and the contacts CA. That is, the contacts CA may be electrically connected to the source/drain regions SD through the silicide layers. The silicide layers may include metal silicide, such as titanium silicide, tantalum silicide or tungsten silicide.

In an embodiment, a gate contact CB and a conductive line CBL are provided on any one of the gate electrodes 135. A first via V1 is disposed between the gate contact CB and the conductive line CBL. The conductive line CBL may be electrically connected to any one of the gate electrodes 135 through the first via V1 and the gate contact CB, and apply a signal to the corresponding gate electrode 135. In an embodiment, the first logic cell C1 includes a first wiring line PW1 located outside the PMOSFET region PR and a second wiring line PW2 located outside the NMOSFET region NR. In an embodiment, the first wiring line PW1 is adjacent a first side of the PMOSFET region PR that is opposite a second side of the PMOSFET region PR that is adjacent a first side of the NMOSFET region NR. In an embodiment, the second wiring line PW2 is adjacent a second side of the NMOSFET region NR that is opposite the first side of the NMOSFET region NR. In exemplary embodiments, the first wiring line PW1 on the PMOSFET region PR serves as a pathway for delivering a drain voltage or a power supply voltage (Vdd). In exemplary embodiments, the second wiring line PW2 on the NMOSFET region NR serves as a pathway for delivering a source voltage or a ground voltage (Vss). The drain voltage may be applied to a drain region/electrode and the source voltage may be applied to a source region/electrode.

Referring back to FIGS. 1 and 2, the first and second wiring lines PW1 and PW2 may extend parallel to the second direction D2, and may be shared by the logic cells adjacent to each other in the second direction D2. As an example, the first wiring line PW1 may be shared by the first and the third logic cell C1 and C3. Further, the first wiring line PW1 may be shared by the PMOSFET regions PR, which are respectively provided in the first and second logic cell C1 and C2.

In exemplary embodiments, a second via V2 is provided on any one of the contacts CA. Accordingly, the source/drain region SD may be electrically connected to the first wiring line PW1 through any one of the contacts CA and the second via V2. Similarly, the source/drain region SD on the NMOSFET region NR may be electrically connected to the second wiring line PW2 through any one of the contacts CA and a third via V3.

Figure 4:
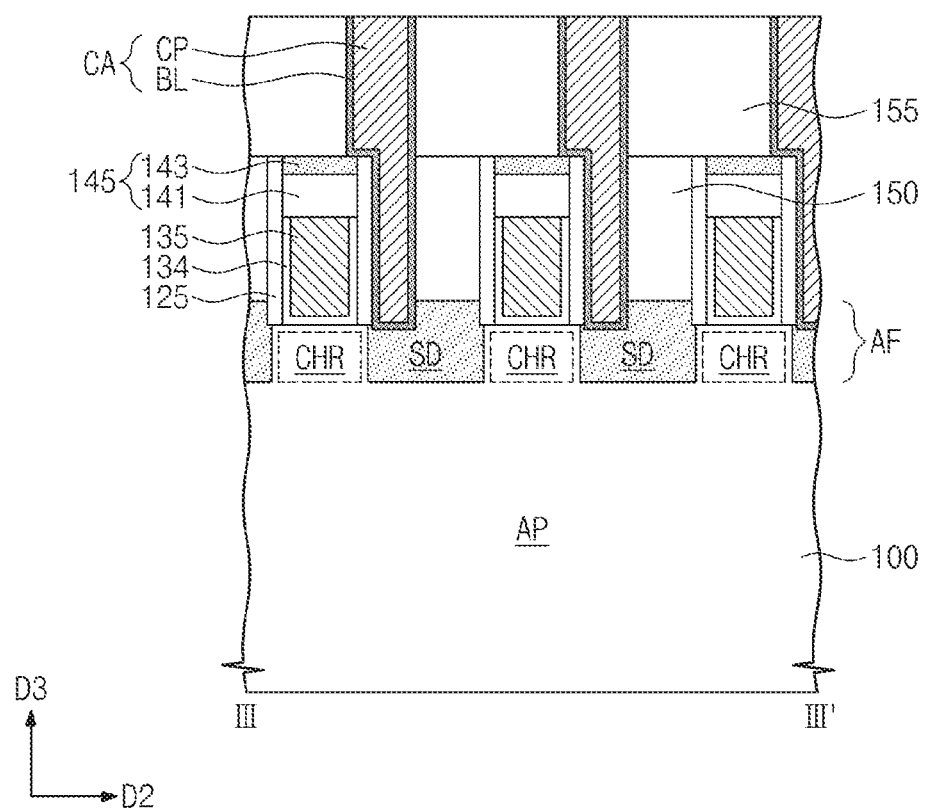
FIG. 4 is a cross-sectional view taken along the line III-III' of FIG. 2, which is illustrated to provide a description of a semiconductor device according to exemplary embodiments of the inventive concept.

FIG. 4 is a cross-sectional view taken along line III-III' of FIG. 2, which is illustrated to provide a description of a semiconductor device according to exemplary embodiments of the inventive concept. In the following description, an element previously described with reference to FIG. 2 and FIGS. 3A and 3B may be identified by a similar or identical reference number without repeating an overlapping description thereof.

Referring to FIG. 4, contact spacers SP are omitted between contacts CA and first and second interlayer insulating layers 150 and 155. Furthermore, the contacts CA are misaligned between gate electrodes 135. That is, when viewed in a plan view, a portion of the contact CA is overlapped with the gate electrode 135. The contact CA and the gate electrode 135 may be spaced apart from each other because a capping structure 145 and gate spacers 125 are interposed between the contact CA and the gate electrode 135.

In an embodiment, at least one second capping pattern 143 of the capping structures 145 directly contacts at least one of the contacts CA. As previously described with reference to FIG. 2 and FIGS. 3A and 3B, the second capping pattern 143 may have a relatively high etching resistance. Accordingly, although misalignment of the contact CA occurs, the gate electrode 135 may be effectively protected by the second capping pattern 143.

Figure 5A:
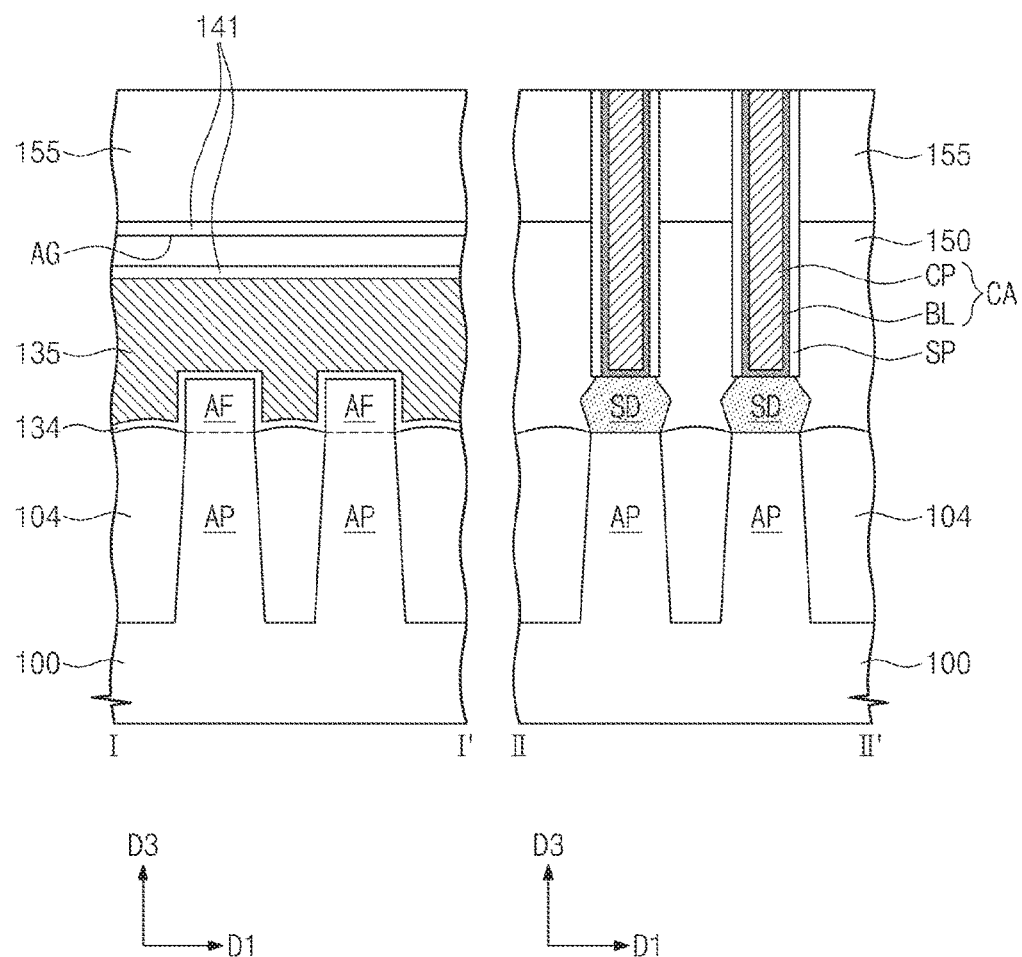
Figure 5C:
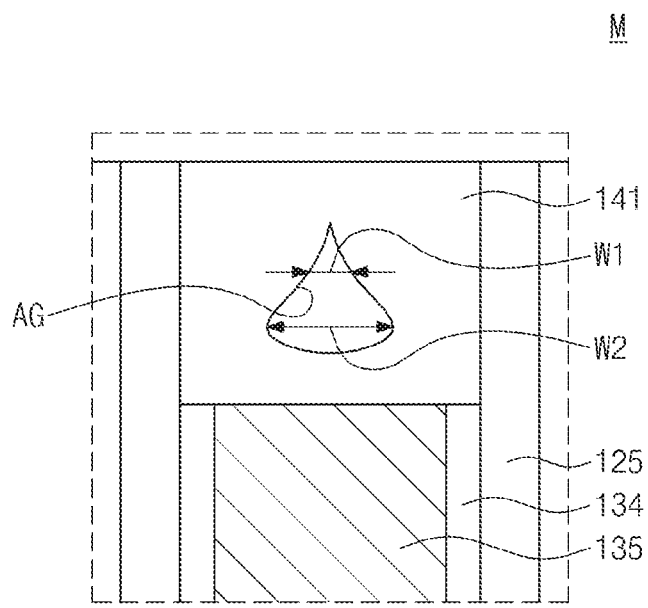

FIGS. 5A to 5C are cross-sectional views illustrating a semiconductor device according to exemplary embodiments of the inventive concept. FIG. 5A is a cross-sectional view taken along the lines I-I' and II-II' of FIG. 2. FIG. 5B is a cross-sectional view taken along the line III-III' of FIG. 2. FIG. 5C is an enlarged cross-sectional view of a portion M in FIG. 2. In the following description, an element previously described with reference to FIG. 2, and FIGS. 3A and 3B may be identified by a similar or identical reference number without repeating an overlapping description thereof.

Referring to FIG. 2 and FIG. 5A to 5C, the capping patterns 143 previously described with reference to FIG. 2, and FIGS. 3A and 3B are omitted. That is, a first capping pattern 141 may cover a top surface of a gate electrode 135, and a top surface of the first capping pattern 141 may be coplanar with a first interlayer insulating layer 150.

In an exemplary embodiment, at least one of the first capping patterns 141 includes an air gap AG or void formed therein. An upper portion of the air gap AG may have a first width W1, and a lower portion of the air gap AG may have a second width W2. In an embodiment, the second width W2 is greater than the first width W1. The air gap AG, whose width increases progressively from the upper portion towards the lower portion, may have a water-droplet shape. The air gap AG may extend in the first direction D1 along the gate electrode 135 and the first capping pattern 141. When viewed in a plan view, the air gap AG may be located at a center of the first capping pattern 141.

A parasitic capacitance between the gate electrode 135 and the first capping pattern 141 may be reduced by forming the air gap inside of the first capping pattern 141. Accordingly, a RC delay phenomenon can be reduced.

Figure 6A:
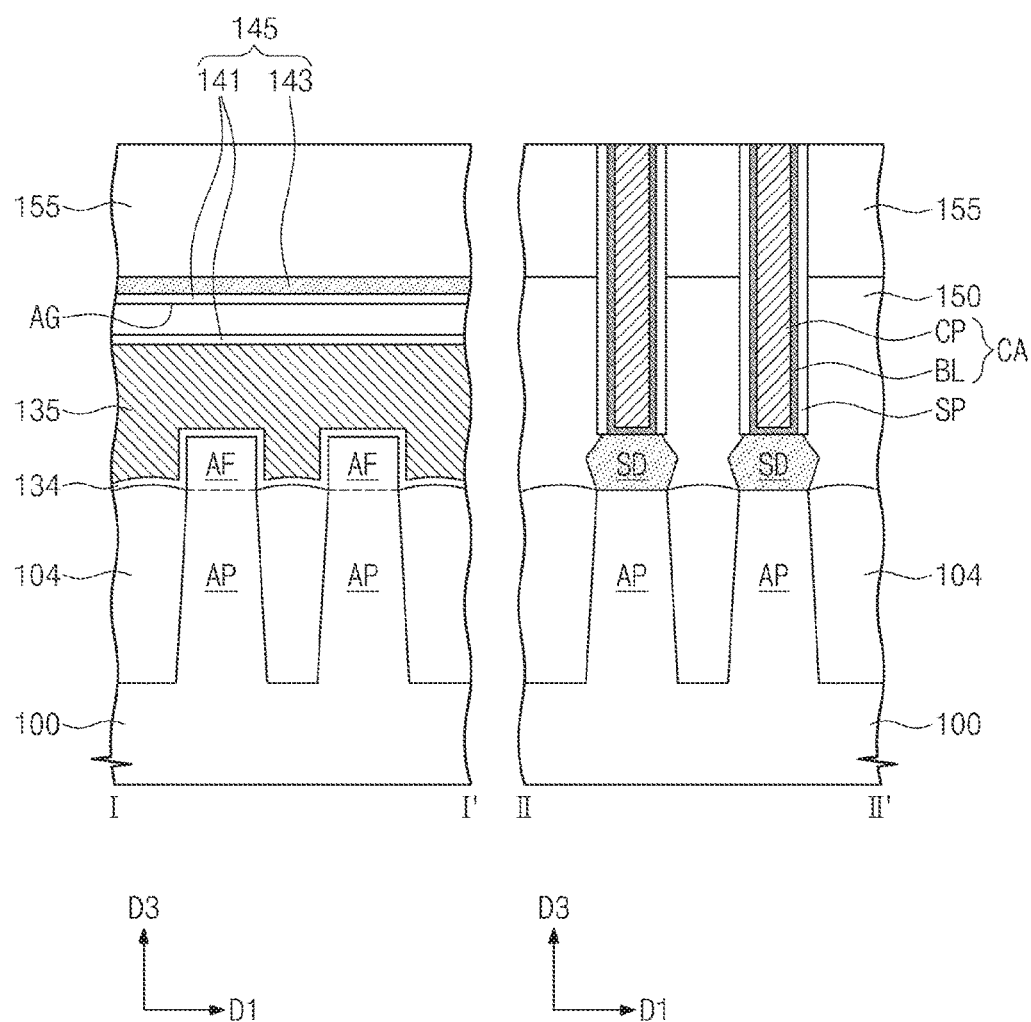
FIGS. 6A to 6B are cross-sectional views illustrating a semiconductor device according to exemplary embodiments of the inventive concept.
Figure 6B:
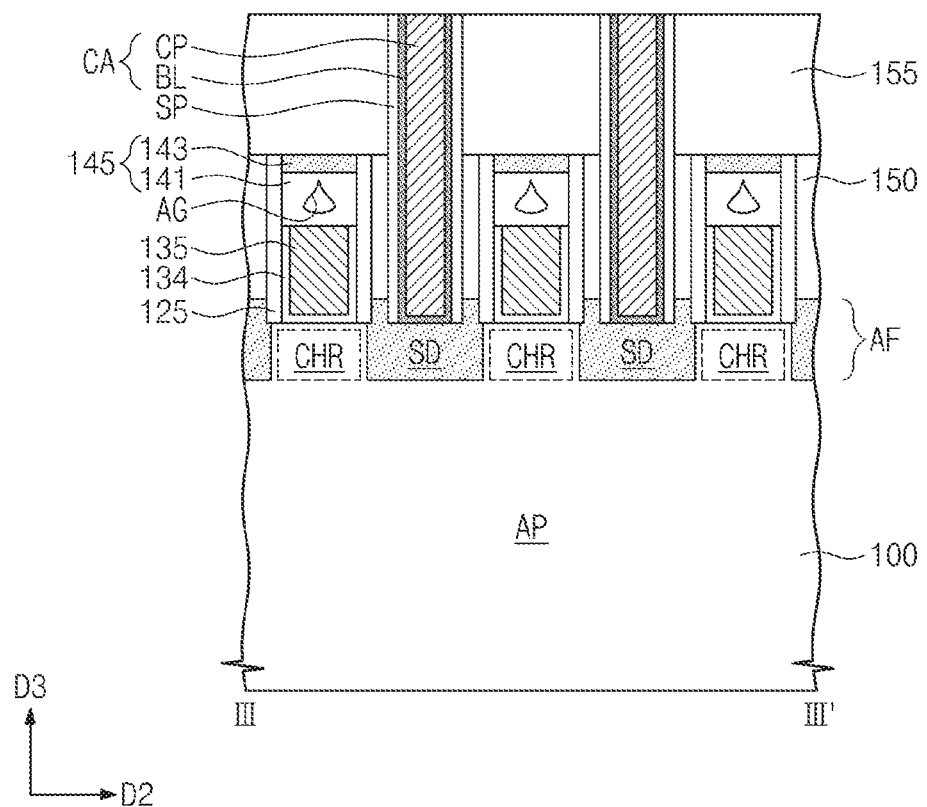

FIGS. 6A and 6B are cross-sectional views illustrating a semiconductor device according to exemplary embodiments of the inventive concept. FIG. 6A is a cross-sectional view taken along the lines I-I' and II-II' of FIG. 2. FIG. 6B is a cross-sectional view taken along the line III-III' of FIG. 2. In the following description, an element previously described with reference to FIG. 2 to FIG. 5C may be identified by a similar or identical reference number without repeating an overlapping description thereof.

In an exemplary embodiment, at least one of first capping patterns 141 includes an air gap AG formed therein. The air gap AG, whose width increases progressively from an upper portion towards a lower portion, may have a water-droplet shape. Furthermore, second capping patterns 143 are provided to completely cover the first capping patterns 141. The first and second capping patterns 141 and 143 together form capping structures 145.

The semiconductor device according to embodiments of the inventive concept may improve a RC-delay because the air gap AG is formed in the capping patterns 141. Furthermore, an upper portion of the gate electrode 135 may be effectively protected by providing the second capping pattern 143 on the first capping pattern 141.

FIGS. 7A to 13A and FIGS. 7B to 13B are cross-sectional views illustrating a method of manufacturing a semiconductor device according to exemplary embodiments of the inventive concept. FIGS. 7A to 13A are cross-sectional views taken along the lines I-I' and II-II' of FIG. 2, and FIGS. 7B to 13B are cross-sectional views taken along the line III-III' of FIG. 2.

Figure 7A:
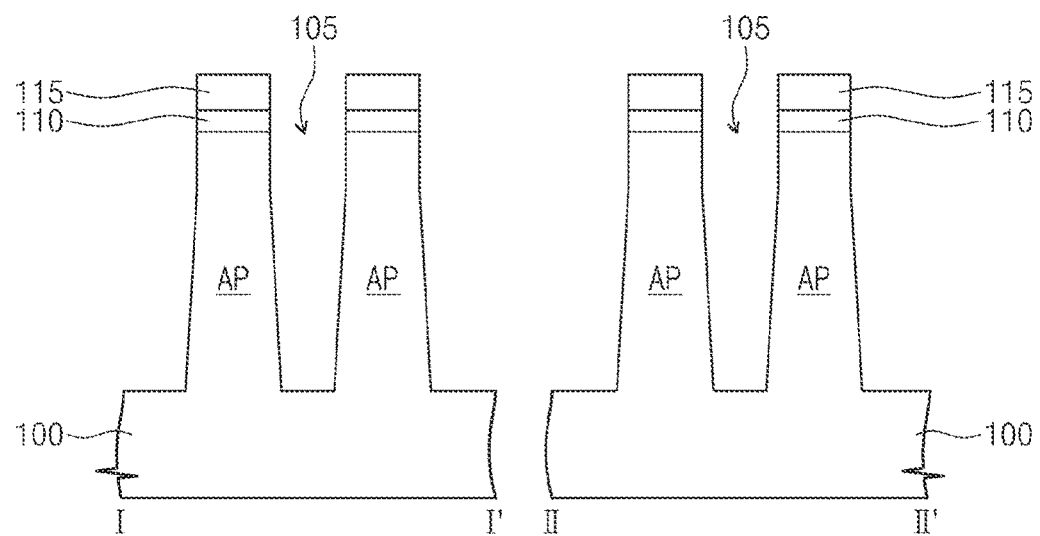
Figure 7B:
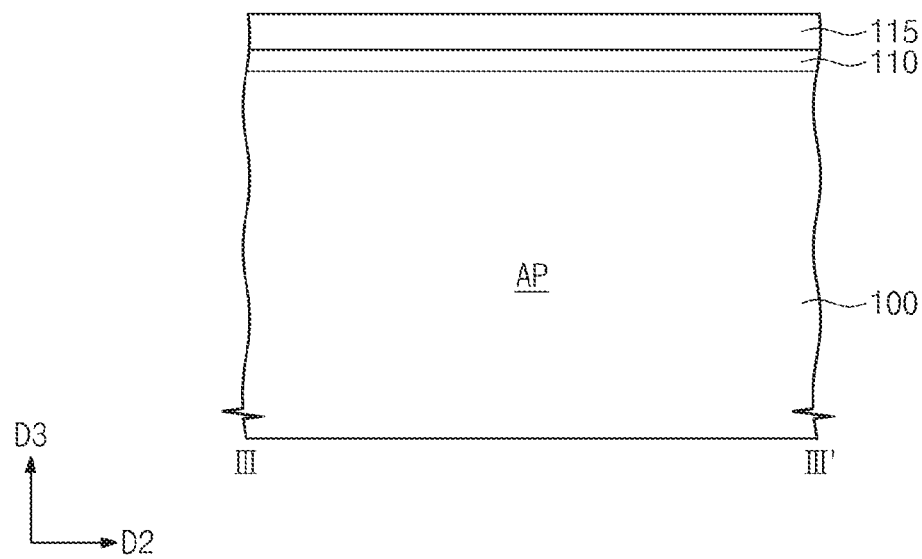

Referring to FIG. 2 and FIGS. 7A and 7B, device isolation trenches 105 are formed on a substrate 100 to define active patterns AP. The substrate 100 may include a silicon substrate, a germanium substrate, a silicon-germanium substrate or a compound semiconductor substrate. In an embodiment, the active patterns AP are doped with a first conductivity type dopant. Forming the device isolation trenches 105 may include forming mask patterns on the substrate and anisotropically etching the substrate using the mask patterns as an etch-mask. The mask patterns include a first mask pattern 110 and a second mask pattern 115 which are sequentially stacked on the substrate 100. In an exemplary embodiment, the device isolation trenches 105 are formed to have an aspect ratio of at least about 5. A width of portions of the device isolation trench 105 may become narrower as they approach an upper surface of the substrate 100. Accordingly, a width of portions of the active pattern AP may become narrower the further they are from the upper surface of the substrate.

Figure 8A:
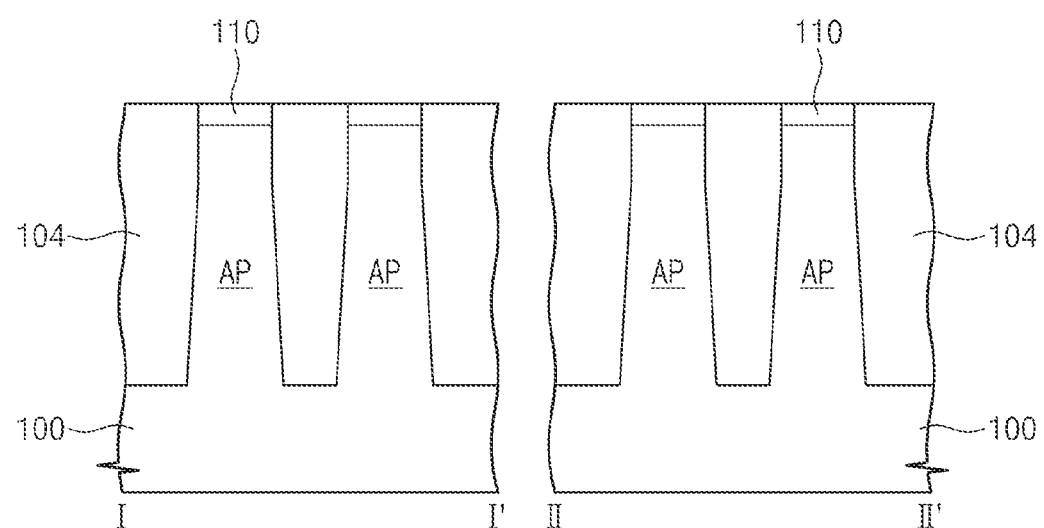
Figure 8B:
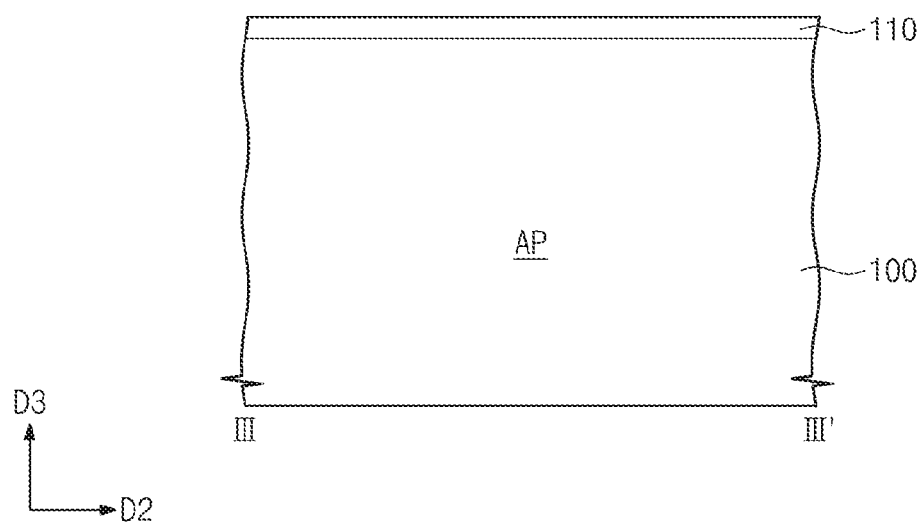

Referring to FIG. 2 and FIGS. 8A and 8B, device isolation layers 104 are formed to fill the device isolation trenches 105. Forming the device isolation layer 104 may include filling the device isolation trench 105 with an insulating layer (e.g., silicon oxide), and planarizing the insulating layer to expose a top surface of the first mask pattern 110. Thus, the device isolation layers 104 may be locally formed in the device isolation trenches 105.

Figure 9A:
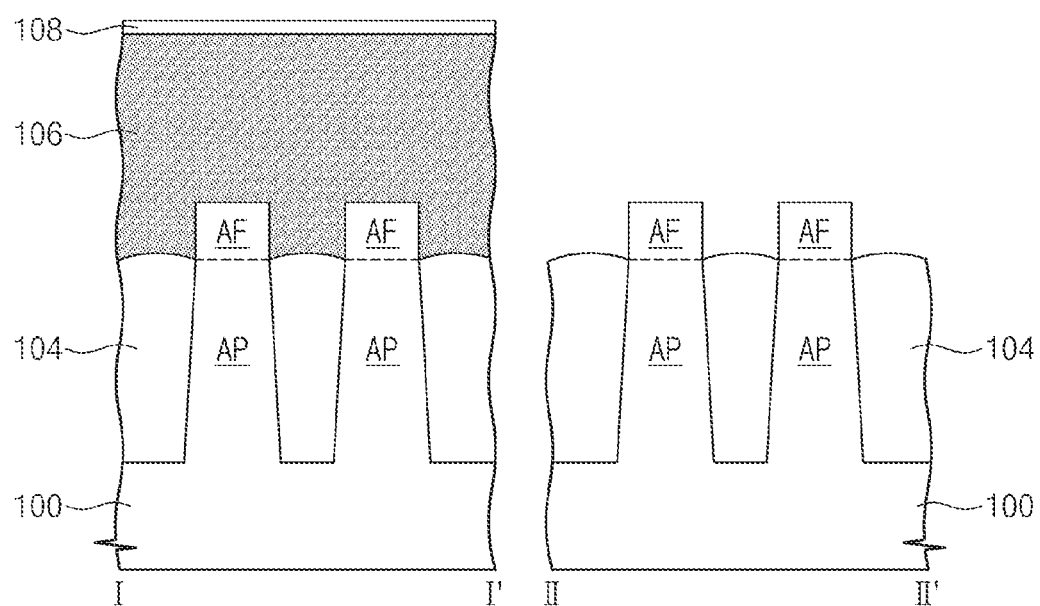
Figure 9A:
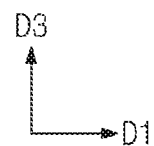
Figure 9A:
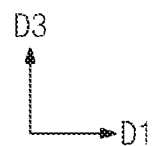
Figure 9B:
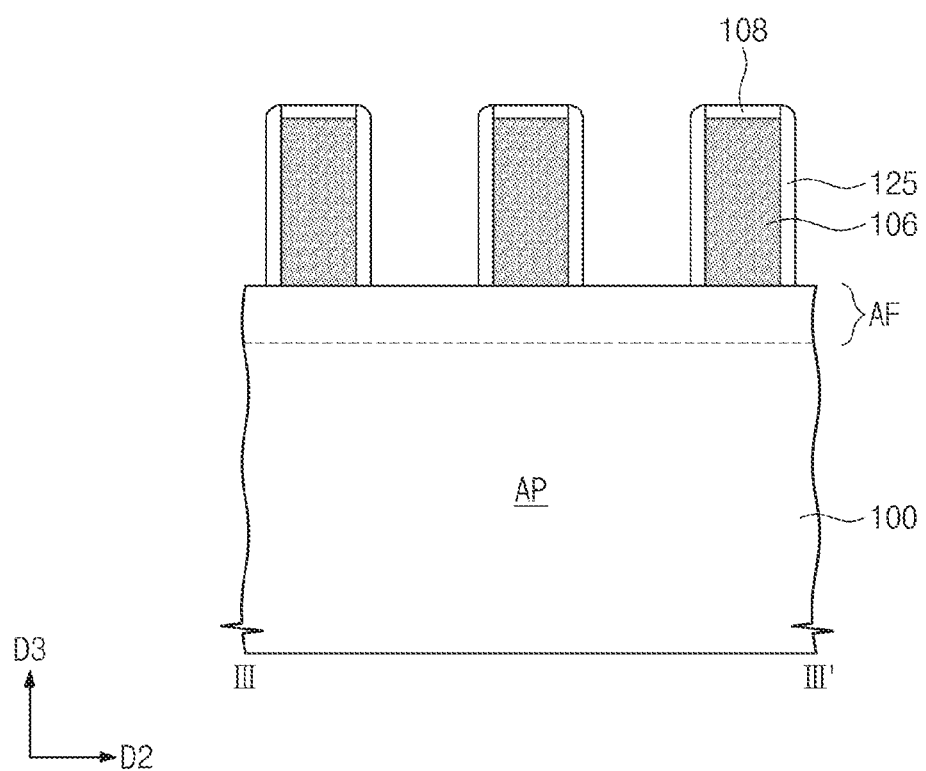

Referring to FIG. 2 and FIGS. 9A and 9B, upper regions (hereinafter, it is referred to as an active fin AF) of the active patterns AP are exposed. In an exemplary embodiment, the active fins AF are exposed by recessing an upper portion of the device isolation layers 104 using a wet etching process. The device isolation layer 104 may have an etching selectivity with respect to the active pattern AP. The first mask pattern 110 may be removed during etching the device isolation layer 104. Accordingly, top surfaces of the active fins AF may be exposed.

The sacrificial gate patterns 106 and gate mask patterns 108 are formed to be sequentially stacked on the active fins AF. In an embodiment, each of the sacrificial gate patterns 106 and the gate mask patterns 108 is formed in a shape (e.g., a line or a bar) extending in a first direction D1 that crosses the active fins AF. For example, the sacrificial gate patterns 106 and the gate mask patterns 108 may be formed by patterning a sacrificial gate layer (not shown) and a gate mask layer (not shown) which are sequentially formed on the active fins AF and the device isolation layers 104. The sacrificial gate layer may include a polycrystalline silicon layer, and the gate mask layer may include a silicon nitride layer or a silicon oxynitride layer.

As shown in FIG. 9B, gate spacers 125 are formed on the opposite sidewalls of each of the sacrificial gate patterns 106. The gate spacers 125 may be formed by conformally forming a spacer layer to cover the sacrificial gate pattern 106 on the substrate 100 and anisotropically etching the spacer layer. The gate spacers 125 may also be formed to cover side walls of the gate mask patterns 108. The spacer layer may include at least one of silicon oxide ($SiO_2$), silicon carbide nitride (SiCN), silicon carbide oxynitride (SiCON) and silicon nitride (SiN).

Figure 10A:
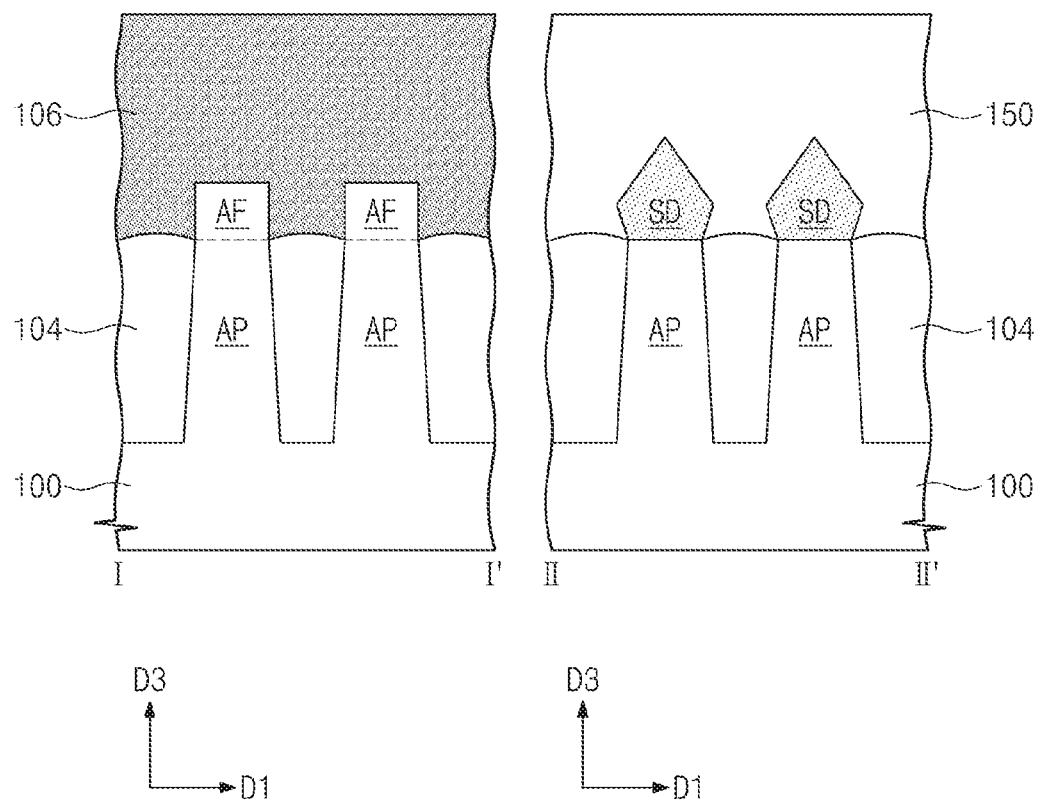
Figure 10B:
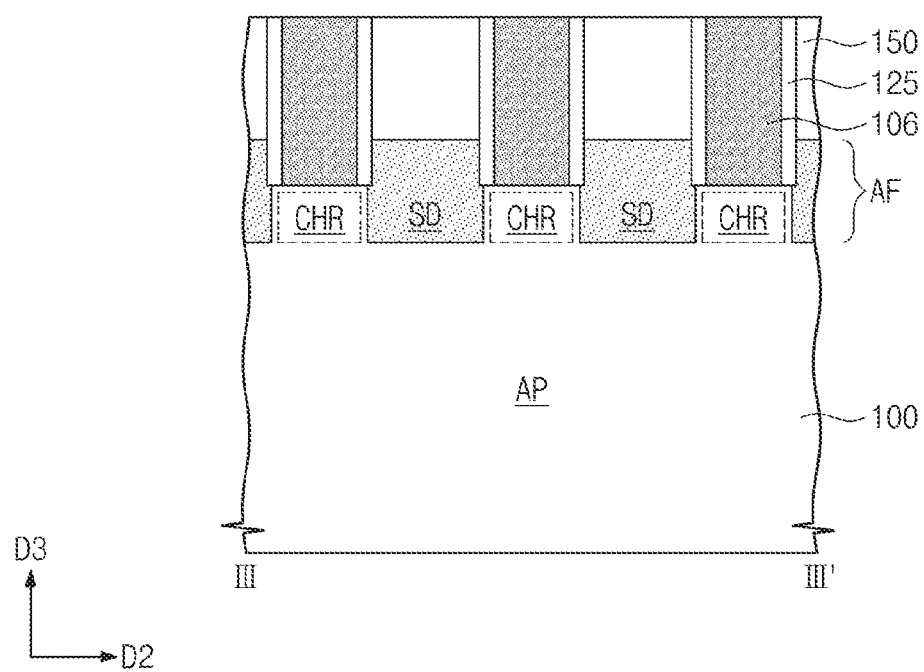

Referring to FIG. 2 and FIGS. 10A and 10B, source/drain regions SD are formed at both sides of each of the sacrificial gate patterns 106. For example, the source/drain regions SD may be formed by a selective epitaxial growth process using the substrate 100 as a seed layer. The selective epitaxial growth process may include a chemical vapor deposition (CVD) process or a molecular beam epitaxy (MBE) process. CVD is a chemical process used in the semiconductor industry to produce thin films. In CVD, the wafer (substrate) is exposed to one or more volatile precursors, which react and/or decompose on the substrate surface to produce the desired deposit. MBE is a method for depositing a single layer, which may take place in a high vacuum and allows films to grow epitaxially.

Firstly, the active fins AP may be selectively etched using the gate mask patterns 108 and the gate spacers 125 as an etch-mask. After etching the active fins AF, the source/drain regions SD may be formed using the exposed active patterns AP as a seed layer. By forming the source/drain regions, channel regions CHR may be defined between the source/drain regions.

In an embodiment, top surfaces of the source/drain regions are positioned at a higher level than those of the channel regions CHR. In addition, the top surfaces of the source/drain regions may have a curvature other than zero. For example, the top surface of the source/drain regions SD may have an upwardly convex shape.

The source/drain regions SD may include a semiconductor element different from the substrate 100. For example, the source/drain regions SD may include a semiconductor element whose lattice constant is greater or smaller than that of the substrate 100. In this case, compressive stress or tensile stress may be created in the channel region CHR because the source/drain regions SD include the semiconductor element different from the substrate 100. As an example, when the substrate 100 is a silicon substrate, the source/drain regions may include silicon-germanium (SiGe) or germanium (Ge). In this case, the compressive stress may be created in the channel region CHR, and a field effect transistor with the source/drain regions SD may be a PMOS-FET. For other example, when the substrate 100 is a silicon substrate, the source/drain regions may include silicon carbide (SiC). In this case, the tensile stress may be created in the channel region CHR, and a field effect transistor with the source/drain regions SD may be an NMOSFET. A mobility of carriers in the channel regions CHR may be improved by introducing the compressive or tensile stress in the channel regions when the field effect transistor is operated.

In an exemplary embodiment, the source/drain regions SD are doped with second conductivity type dopants different from a first conductivity type of the active pattern AP. For example, the second conductivity type dopants may be in-situ doped when the source/drain regions SD are formed. In another example, after forming the source/drains SD, the second conductivity type dopants may be implanted into the source/drain regions SD.

A first interlayer insulating layer 150 covering the source/drain regions SD may be formed. For example, the first interlayer insulating layer 150 may be formed on the entire region of the substrate 100 to cover the sacrificial gate patterns 106 and the gate mask patterns 108. The first interlayer insulating layer 150 may include a silicon oxide layer, and may be formed by a Flowable Chemical Vapor Deposition (FCVD) process.

The first interlayer insulating layer 150 may be planarized until top surfaces of the sacrificial gate patterns 106 are exposed. The planarization of the interlayer insulating layer 150 may be performed by using etch-back or a Chemical Mechanical Polishing (CMP) process. CMP, also known as Chemical Mechanical Planarization, is a polishing process, which utilizes a chemical slurry formulation and mechanical polishing process to remove unwanted conductive or dielectric materials on a silicon wafer, to achieve a near flat and smooth surface upon which layers of integrated circuitry can be formed. The gate mask patterns 108 may be removed by the planarization process, and then the top surfaces of the sacrificial gate patterns 106 may be exposed. Upper portions of the gate spacers 125 may be removed by the planarization process. Accordingly, the top surface of the first interlayer insulating layer 150 may be coplanar with the top surfaces of the sacrificial gate patterns 106 and the top surfaces of the gate spacers 125.

Figure 11A:
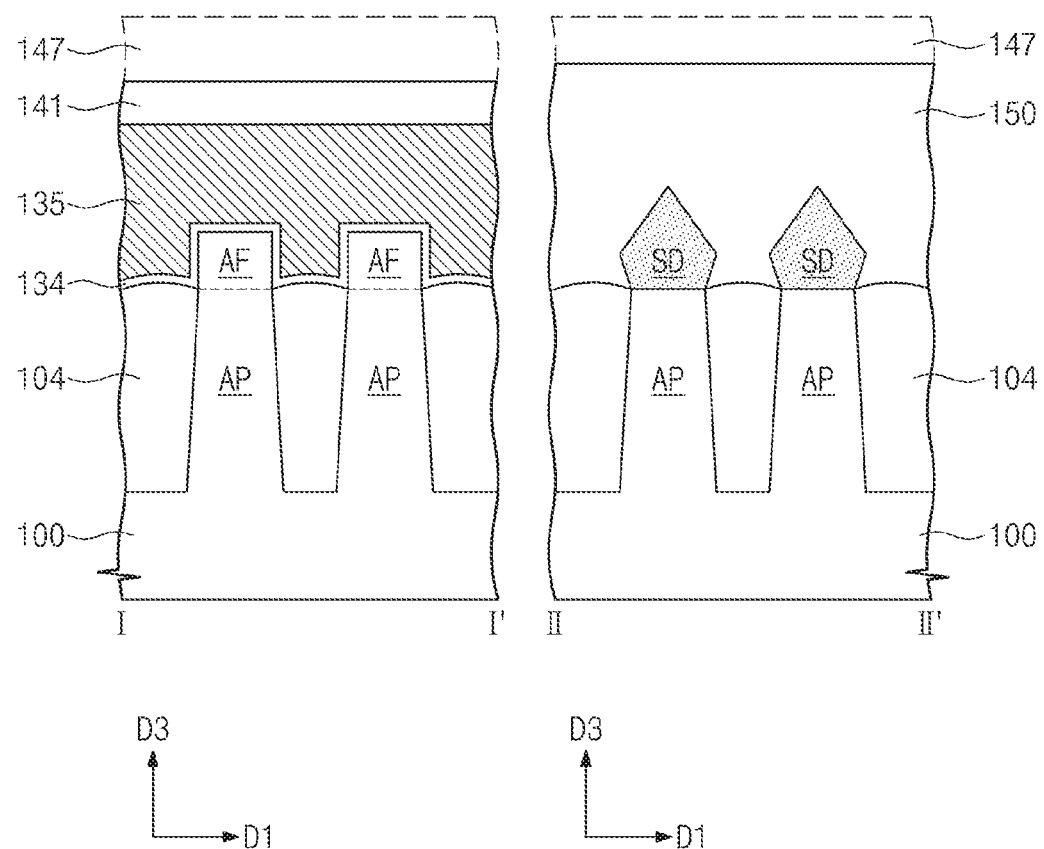
Figure 11B:
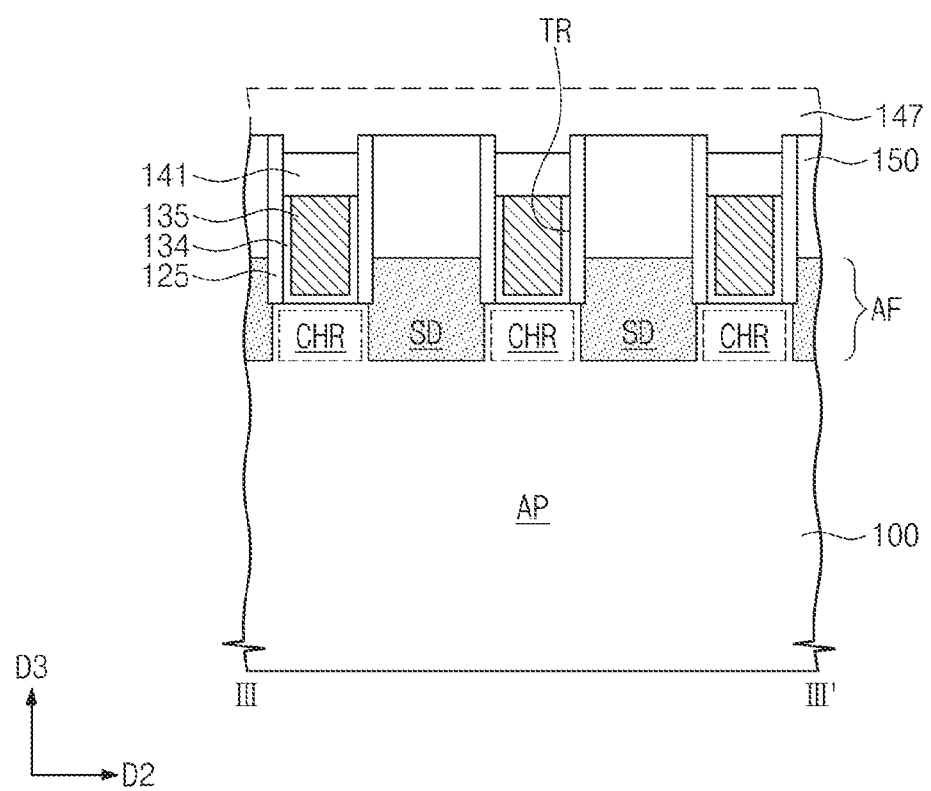

Referring to FIG. 2 and FIGS. 11A and 11B, the sacrificial gate patterns 106 are replaced with gate structures. Each of the gate structures includes a gate dielectric layer 134, a gate electrode 135 and a capping structure 145 (e.g., see FIG. 12A). The capping pattern 141 illustrated in FIGS. 11 and 11B is part of the capping structure 145.

Firstly, the sacrificial gate patterns 106 shown in FIGS. 10A and 10B are removed to form gate trenches TR. The gate trenches TR may be formed by an etching process which selectively removes the sacrificial gate patterns 106. The gate trench TR may be defined by the gate spacer 125. In an embodiment, the channel region CHR of the active fin AF is exposed by the gate trench TR. The gate trench TR may extend in the first direction D1 and a part of the top surface of the device isolation layer 104 may be exposed by the gate trench TR.

In an embodiment, the gate dielectric layer 134 and the gate electrode 135 are formed in each of the gate trenches TR. The gate dielectric layer 134 may be conformally formed in the gate trench TR. The gate dielectric layer 134 may be formed by Atomic Layer Deposition (ALD) or a chemical oxidation process. ALD is a thin film deposition technique that is based on the sequential use of a gas phase chemical process. The ALD process may apply precursors in sequence that react with the surface of a material to allow a thin film to be deposited. The gate dielectric layer 134 may include a high-k dielectric material. The high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide and lead zinc niobate.

A gate electrode layer may be formed on the gate dielectric layer 134 to fill the gate trench TR, and then the gate electrode layer and the gate dielectric layer 134 may be planarized until a top surface of the first interlayer insulating layer 150 is exposed. Accordingly, the gate dielectric layer 134 and the gate electrode 135 may be locally formed in the gate trench TR. The gate dielectric layer 134 and the gate electrode 135 may extend in the first direction D1. The gate electrode layer may include at least one of conductive metal nitride (e.g., titanium nitride or tantalum nitride) and metal material (e.g., titanium, tantalum, tungsten, copper or aluminum). The gate electrode layer may be formed by a deposition process such as CVD or a sputtering process. A planarization process of the gate electrode layer and the gate dielectric layer 134 may include a CMP process.

Upper portions of the gate electrodes 135 may be recessed into the gate trench TR. Thus, top surfaces of the gate electrodes 135 may be positioned at a lower level than those of the gate trenches TR (that is to say, the top surfaces of the gate spacers). In an exemplary embodiment, a part of the gate dielectric layer 134 positioned at a higher level than the top surface of the gate electrode 135 is removed after the upper portion of the gate electrode 135 is recessed. The gate dielectric layer 134 may be disposed between the gate electrode 135 and the active fin AF, and between the gate electrode 135 and the gate spacer 125.

First capping patterns 141 may be formed on the recessed gate electrodes 135, respectively. For example, a first capping layer 147 may be formed to cover top surfaces of the gate electrodes 135. The first capping layer 147 may be formed to completely fill remaining portions of the gate trenches TR. The first capping layer 147 may be formed by ALD, plasma enhanced CVD or high density plasma CVD. The first capping patterns 141 may be formed in the gate trenches TR by recessing an upper portion of the first capping layer 147. Top surfaces of the recessed first capping pattern 141 may be positioned at a level lower than those of the gate trenches TR (that is to say, the top surfaces of the gate spacers).

The first capping layer 147 may be formed of a material with etch selectivity with respect to the first interlayer insulating layer 150 and a second interlayer insulating layer 155 which will be described later. For example, the first capping layer 147 may include at least one of silicon oxynitride (SiON), silicon carbide nitride (SiCN), silicon carbide oxynitride (SiCON) and silicon nitride (SiN). As an example, the first capping layer 147 may include a silicon carbide nitride layer whose dielectric constant is relatively low.

Figure 12A:
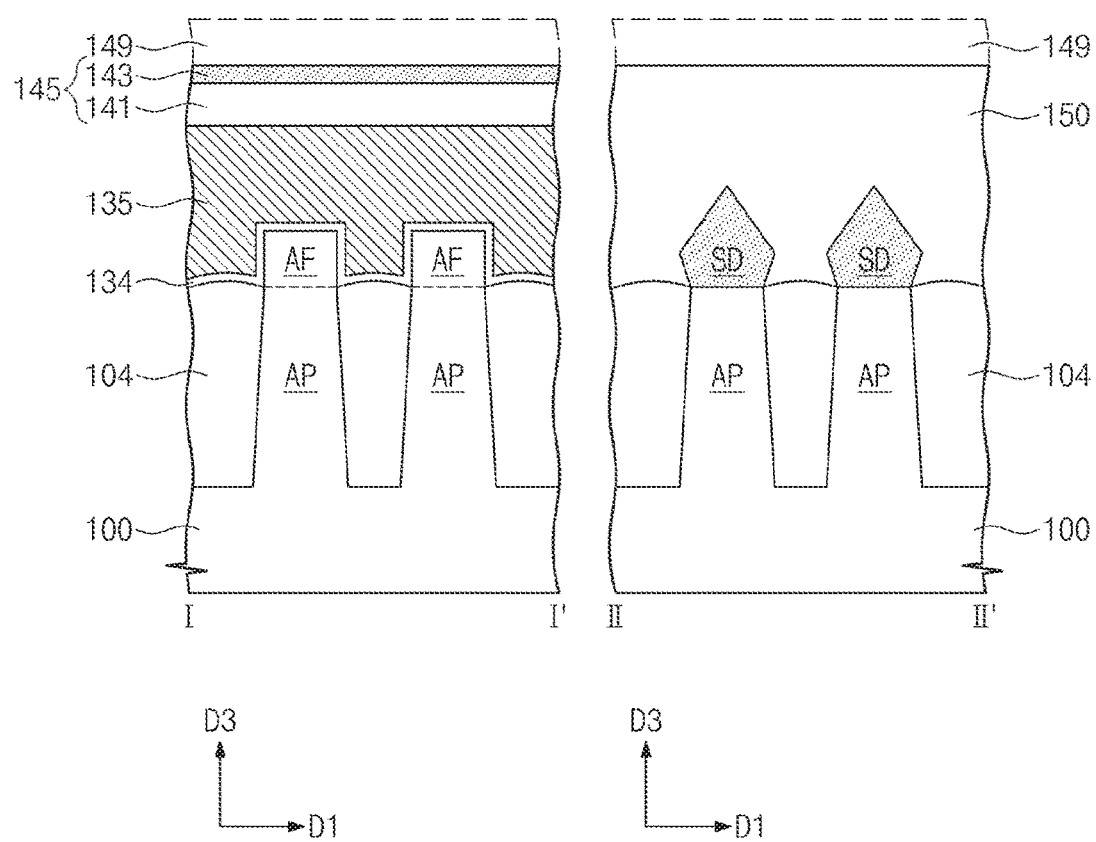
Figure 12B:
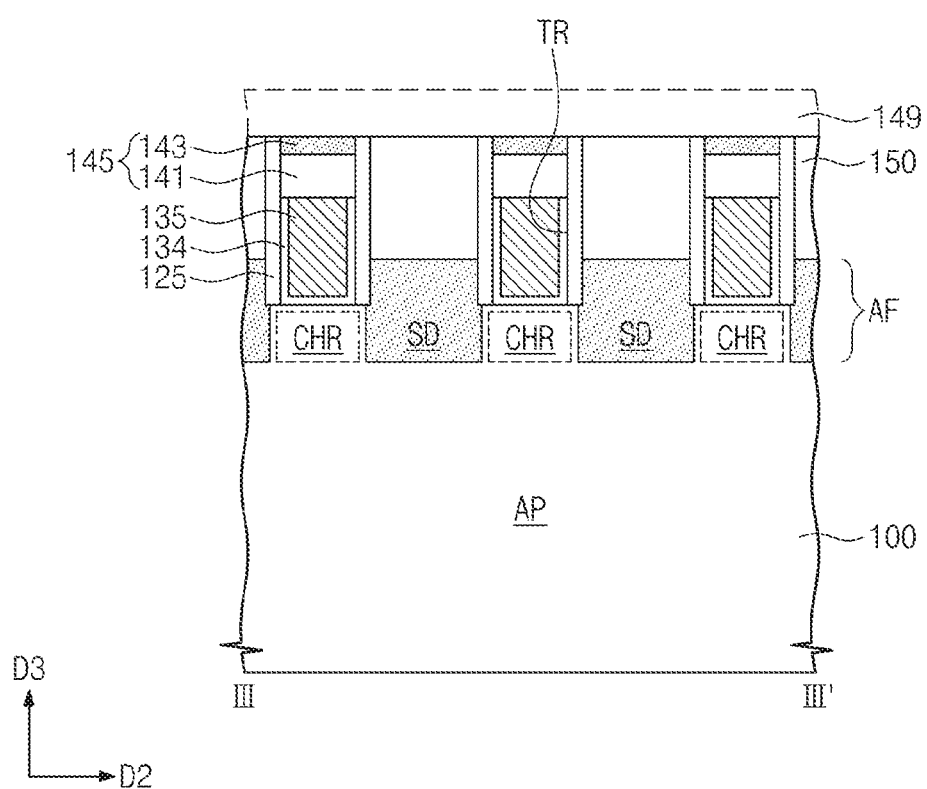

Referring to FIGS. 2 and 12A to 12B, second capping patterns 143 are formed on the first capping patterns 141, respectively. The second capping pattern 143 may fill a remaining portion of the gate trench TR. The first and second capping patterns 141 and 143 may constitute the capping structure 145.

For example, a second capping layer 149 may be formed to cover a top surface of the first capping pattern 141. The second capping layer 149 may be formed to completely fill remaining portions of the gate trenches TR. In exemplary embodiments, the second capping layer 149 may be formed by ALD, plasma enhanced CVD or high density plasma CVD. The second capping layer 149 may be planarized until the top surfaces of the first interlayer insulating layer 150 and the gate spacers 125 are exposed. Accordingly, the second capping patterns 143 may be formed on the first capping patterns 141, respectively. The second capping patterns 143 may have flat top surfaces. Furthermore, the top surfaces of the second capping patterns 143 may be coplanar with the top surfaces of the first interlayer insulating layer 150 and the gate spacers 125.

The second capping layer 149 may be formed of a material with etch selectivity with respect to the first interlayer insulating layer 150 and a second interlayer insulating layer 155, which will be described later. For example, the second capping layer 149 may include at least one of silicon oxynitride (SiON), silicon carbide nitride (SiCN), silicon carbide oxynitride (SiCON) and silicon nitride (SiN). As an example, the second capping layer 149 may include a silicon nitride layer whose dielectric constant is relatively high.

Figure 13A:
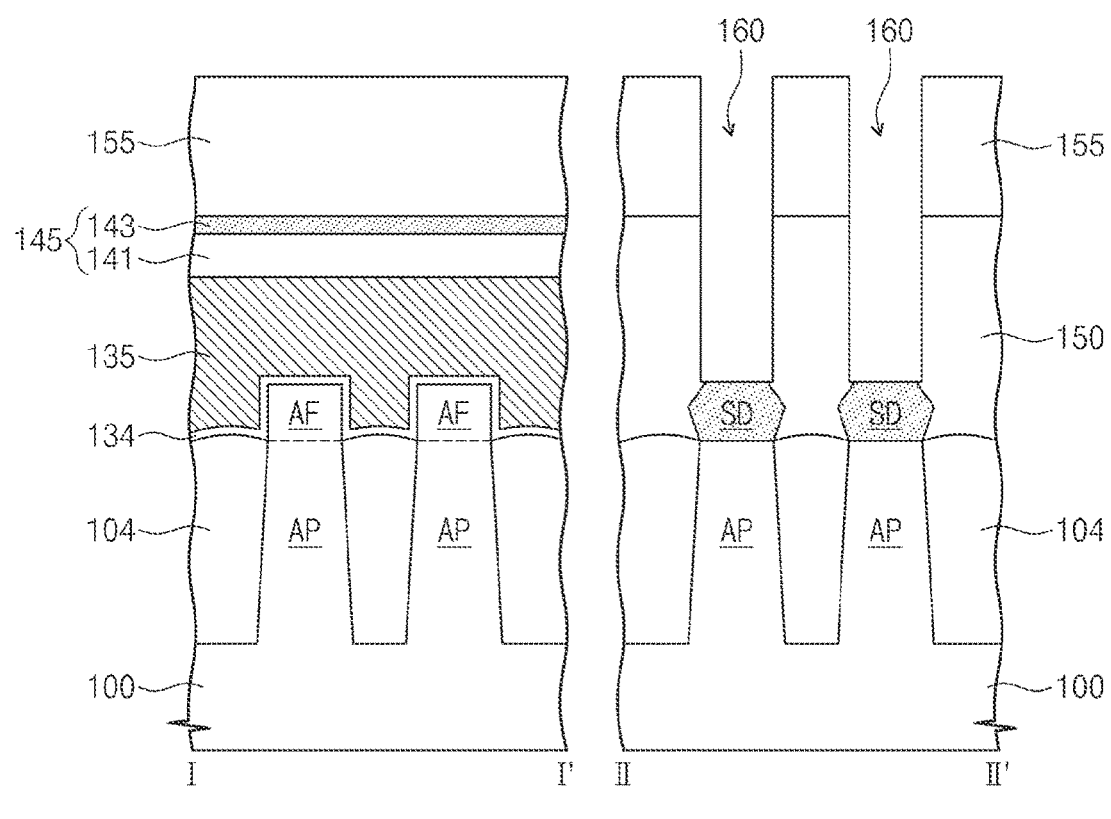
Figure 13B:
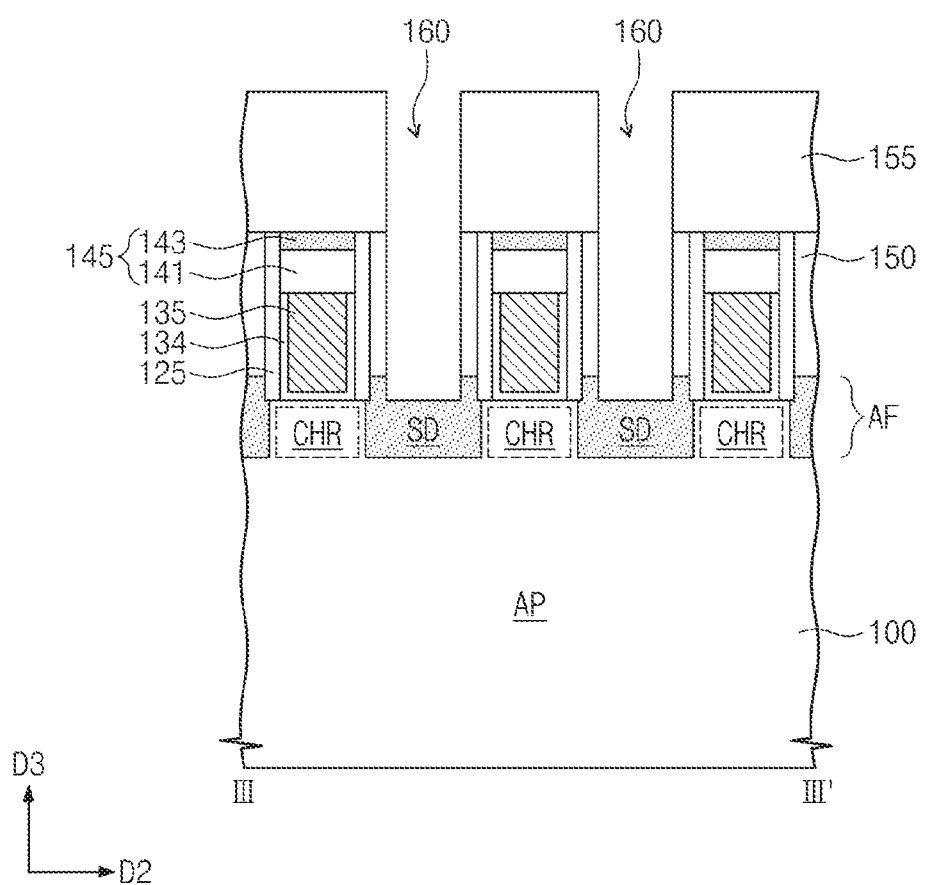

Referring to FIGS. 2 and 13A to 13B, a second interlayer insulating layer 155 is formed on the first interlayer insulating layer 150 and the capping structures 145. The second interlayer insulating layer 155 may include a silicon oxide layer or a low-k oxide layer. As an example, the low-k oxide layer may include a silicon oxide layer doped with carbon such as SiCOH. The second interlayer insulating layer 155 may be formed by a CVD process.

In an embodiment, contact holes 160 are formed to penetrate the second and first interlayer insulating layers 155 and 150 and expose the source/drain regions SD. The contact holes 160 may be self-aligned by the capping structures 145 and the gate spacers 125. The contact holes 160 may be formed by performing an anisotropic etching process using a photoresist pattern (not shown) as a etch mask. The photoresist pattern (not shown) may include openings (not shown) corresponding to the contact holes 160.

While forming the contact holes, upper portions of the source/drain regions SD may be partially etched. Accordingly, the upper portions of the source/drain regions SD may be recessed.

The second capping patterns 143 may protect top surfaces of the gate electrodes 135 from an etching process for forming the contact holes. The gate spacers 125 may protect opposite sidewalls of the gate electrodes 135 from the etching process. Accordingly, the contact holes 160 can be effectively self-aligned so as not to expose the gate electrode 135. In addition, a parasitic capacitance between the gate electrode 135 and the capping structure 145 can be reduced because the first capping pattern 141 disposed under the second capping pattern 143 includes a relatively low dielectric constant material. Accordingly, RC-delay of the device can be improved.

In exemplary embodiments, although not shown, silicide layers (not shown) may be formed on the source/drain regions SD exposed by the contact holes 160. Forming the silicide layer may include forming a metal layer on the source/drain regions SD and forming a metal-silicide layer by performing a heat treatment on the metal layer. The silicide layer may include at least one of titanium silicide, tantalum silicide and tungsten silicide.

Referring back to FIGS. 2 and 3A to 3B, contact spacers SP may be formed to cover sidewalls of the contact holes 160. Forming the contact spacer SP may include conformally forming a spacer layer so as not to completely fill the contact hole 160 and forming the contact spacer SP in the contact hole 160 by anisotropically etching the spacer layer.

Contacts CA may be formed in the contact holes 160. Each of the contacts CA may include a conductive pillar CP and a barrier layer BL surrounding the conductive pillar CP. The barrier BL may include metal nitride, for example, titanium or titanium nitride. The conductive pillar CP may include metal, for example, tungsten.

Figure 14:
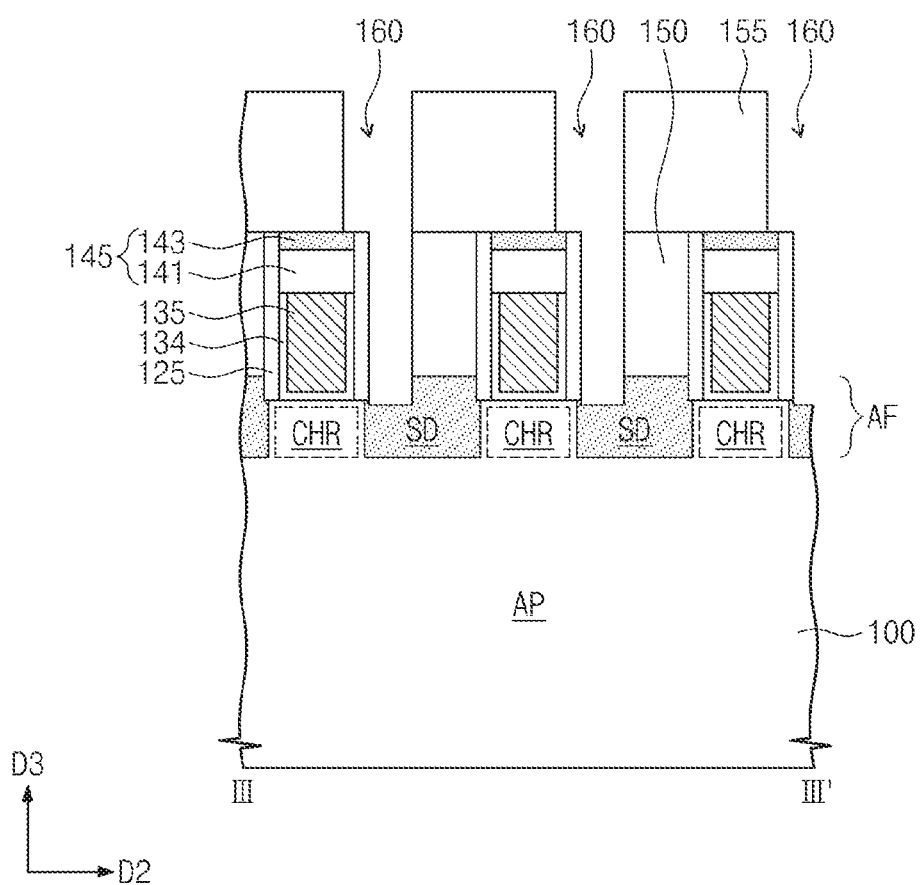
FIG. 14 is a cross-sectional view illustrating a method of manufacturing a semiconductor device according to exemplary embodiments of the inventive concept.

FIG. 14 is a cross-sectional view illustrating a method of manufacturing a semiconductor device according to exemplary embodiments of the inventive concept. FIG. 14 is the cross-sectional view taken along the line III-III' of FIG. 2. In the following description, an element previously described with reference to FIGS. 7A to 13A and FIGS. 7B to 13B may be identified by a similar or identical reference number without repeating an overlapping description thereof.

Referring to FIG. 14, contact holes 160 are formed on the resulting structure of FIGS. 12A and 12B to penetrate second and first interlayer insulating layers 155 and 150 and expose top surfaces of source/drain regions SD. The contact holes 160 may be offset from a center between the gate electrodes 135 because of misalignment. Accordingly, at least one of the contact holes 160 partially exposes a top surface of a second capping pattern 143 and a top surface and a sidewall of a gate spacer 125. When a photoresist pattern (not shown) defining the contact holes 160 is misaligned, capping structures 145 may be damaged during an anisotropic etching process for forming the contact holes 160. In exemplary embodiments of the inventive concept, the second capping patterns 143 exposed by the contact holes 160 have a higher dielectric constant and etch selectivity than first capping patterns 141. Thus, a top surface of the gate electrodes 135 may be effectively protected from etching damage during the anisotropic etching process.

Referring back to FIG. 4, contacts CA may be formed in the contact holes 160. Each of the contacts CA may include a conductive pillar CP and a barrier layer BL surrounding the conductive pillar CP.

Figure 15A:
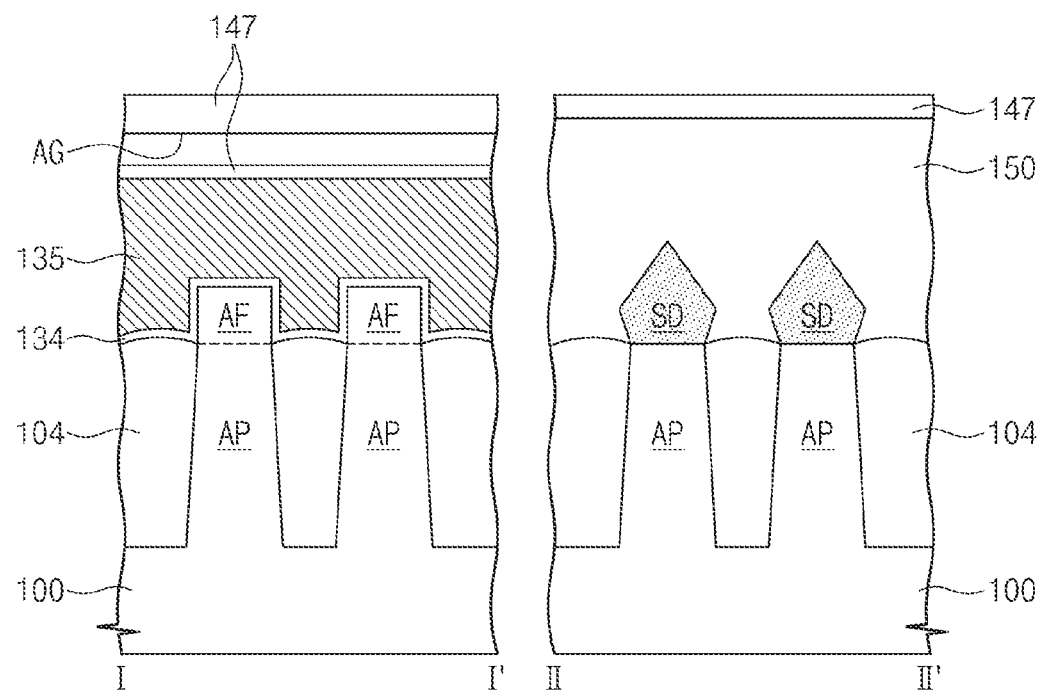
FIGS. 15A and 15B are cross-sectional views illustrating a method of manufacturing a semiconductor device according to exemplary embodiments of the inventive concept.
Figure 15B:
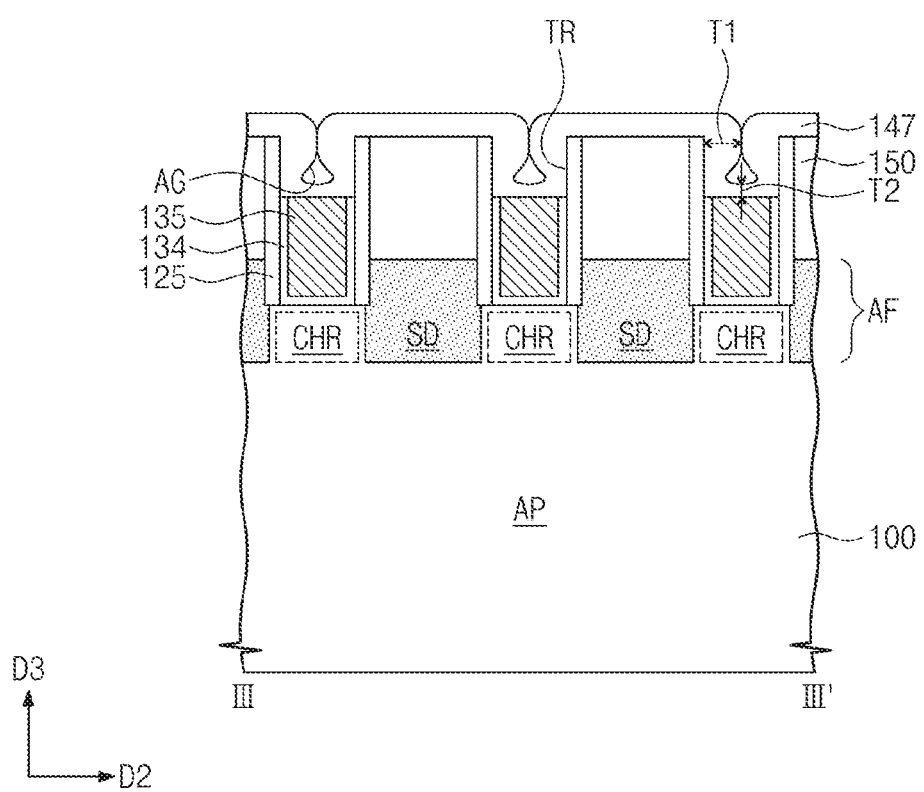

FIGS. 15A and 15B are cross-sectional views illustrating a method of manufacturing a semiconductor device according to exemplary embodiments of the inventive concept. FIG. 15A is a cross-sectional view taken along lines I-I' and II-II' of FIG. 2, and FIG. 15B is a cross-sectional view taken along line III-III' of FIG. 2. In the following description, an element previously described with reference to FIGS. 7A to 13A and FIGS. 7B to 13B may be identified by a similar or identical reference number without repeating an overlapping description thereof.

Referring to FIGS. 2, 15A and 15B, the sacrificial gate patterns 106 are removed on the resulting structure of FIGS. 2, 10A and 10B to form gate trenches TR. Gate dielectric layers 134 and gate electrodes 135 may be formed in the gate trenches TR. A top surface of the gate electrode 135 may be positioned at a lower level than that of the trench TR. A first capping layer 147 may be formed to cover the top surface of the gate electrode 135 and fill remaining portions of the gate trench TR. The first capping layer 147 may be deposited in a way to provide poor step coverage using Physical Vapor Deposition (PVD) or Chemical Vapor Deposition (CVD) techniques. For example, the first capping layer 147 may be formed by plasma enhanced CVD or high density plasma CVD techniques. PVD uses physical processes such as heating or sputtering to produce a vapor of material, which is then deposited on the object that requires coating.

In an embodiment, thicknesses of the first capping layer 147 on the sidewall of the gate trench TR and on the top surface of the gate electrode 135 are different from each other because the first capping layer 147 is deposited in the way to provide poor step coverage. Accordingly, an air gap AG or void surrounding the first capping layer 147 may be formed in at least one of the gate trenches TR during depositing of the first capping layer 147.

In an embodiment, the first capping layer 147 deposited on the sidewall of the gate trench TR has a first thickness T1, and the first capping layer 147 deposited on the top surface of the gate electrode 135 has a second thickness T2. In an exemplary embodiment, the first thickness T1 is greater than the second thickness T2. As shown in FIG. 5C, an upper portion of the air gap AG has a first width W1, and a lower portion of the air gap AG has a second width W2. In an embodiment, the second width W2 is greater than the first width W1. Accordingly, the air gap AG, whose width increases progressively from the upper portion towards the lower portion, may have a water-droplet shape.

Referring back to FIGS. 2, 5A and 5B, the first capping layer 147 is planarized until the top surfaces of the first interlayer insulating layer 150 and the gate spacers are exposed. Accordingly, first capping patterns 141 may be formed to cover the top surfaces of the gate electrodes 135. The air gap AG may be formed inside of each of the first capping patterns 141. A parasitic capacitance between the gate electrode 135 and the first capping pattern 141 may be reduced by forming the air gap inside the first capping pattern 141. Accordingly, a RC delay phenomenon can be reduced.

A second interlayer insulating layer 155 may be formed on the first interlayer insulating layer 150 and the first capping patterns 141. Contact holes 160 may be formed to penetrate the second and first interlayer insulating layer 155 and 150 and expose the source/drain regions SD. Contacts CA may be formed in the contact holes 160.

Figure 16A:
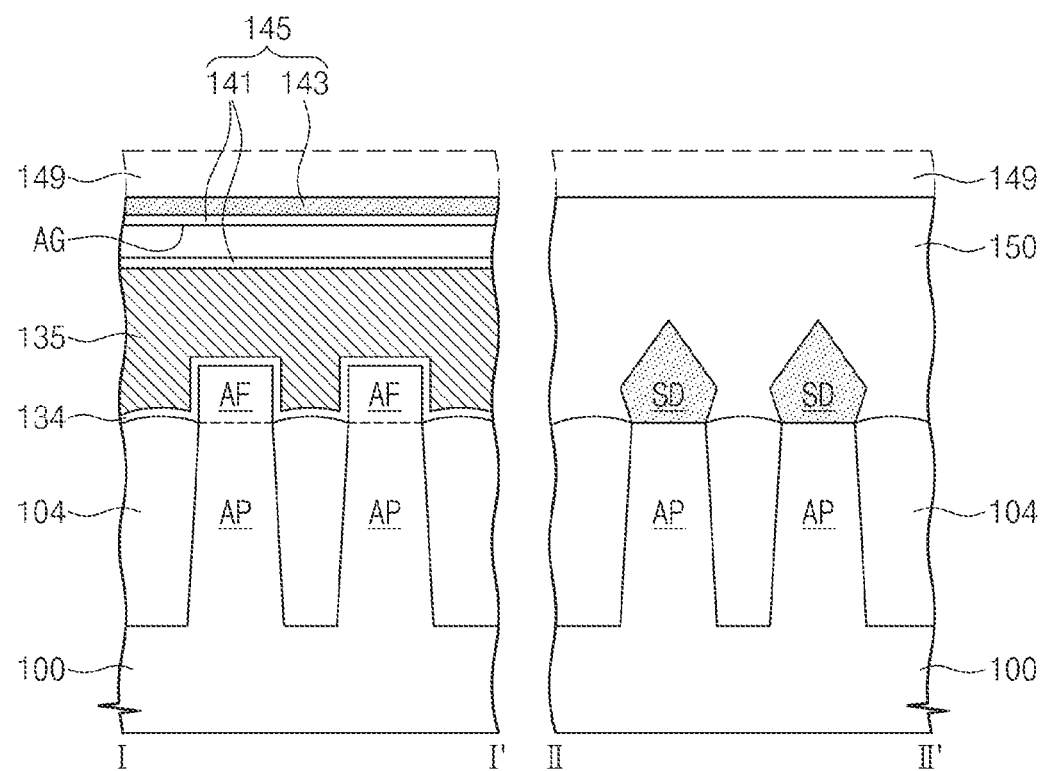
FIGS. 16A and 16B are cross-sectional views illustrating a method of manufacturing a semiconductor device according to exemplary embodiments of the inventive concept.
Figure 16B:
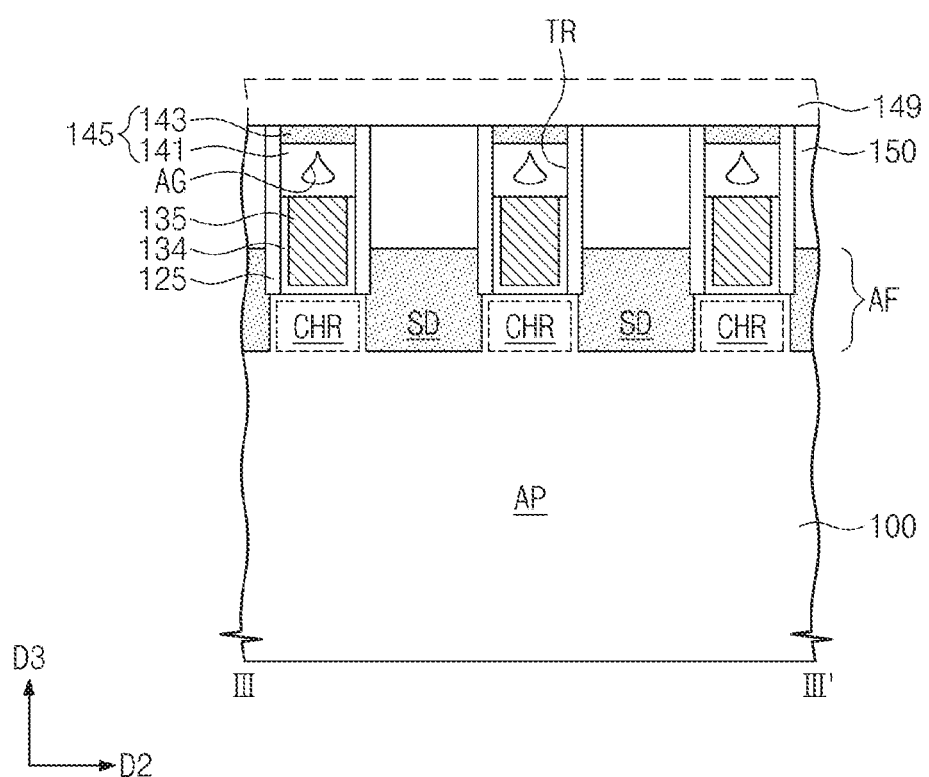

FIGS. 16A and 16B are cross-sectional views illustrating a method of manufacturing a semiconductor device according to embodiments of the inventive concept. FIG. 16A is a cross-sectional view taken along the lines I-I' and II-II' of FIG. 2, and FIG. 16B is a cross-sectional view taken along the line III-III' of FIG. 2. In the following description, an element previously described with reference to FIGS. 7A to 13A and FIG. 15A and FIGS. 7B to 13B and FIG. 15B may be identified by a similar or identical reference number without repeating an overlapping description thereof.

Referring to FIGS. 16A and 16B, first capping patterns 141 are formed on the gate electrodes 135 by recessing an upper portion of the first capping layer 147 on the resulting structure of the FIGS. 2, 15A and 15B. Top surfaces of the first capping patterns 141 may be positioned at a level lower than those of the gate trenches TR. At least one of the first capping patterns 141 may include an air gap AP inside.

Second capping patterns 143 may be formed on the first capping patterns 141. The second capping patterns 143 may completely fill remaining portions of the gate trenches TR. The first and second capping patterns 141 and 143 may constitute capping structures 145. For example, a second capping layer 149 may be formed to cover the first capping patterns 141. Thereafter, the second capping patterns 143 may be formed by performing a planarization on the second capping layer 149.

Referring back to FIGS. 2, 6A and 6B, a second interlayer insulating layer 155 may be formed on the first interlayer insulating layer 150 and the capping structures 145. Contact holes 160 may be formed to penetrate the second and first interlayer insulating layer 155 and 150 and expose the source/drain regions SD. Contacts CA may be formed in the contact holes 160.

Figure 17:
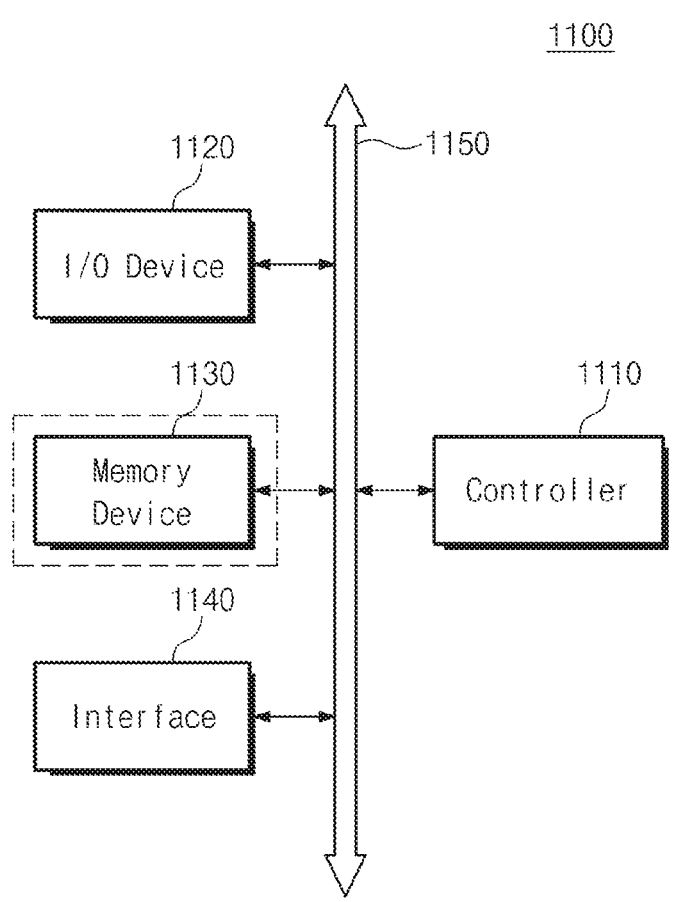
FIG. 17 is a schematic block diagram illustrating an example of an electronic system including a semiconductor device according to exemplary embodiments of the inventive concept.

FIG. 17 is a schematic block diagram illustrating an example of electronic systems including a semiconductor device according to exemplary embodiments of the inventive concept.

Referring to FIG. 17, an electronic system 1100 according to exemplary embodiments of the inventive concept includes a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other similar logic devices. The I/O unit 1120 may include a keypad, a keyboard or a display unit. The memory device 1130 may store data and/or commands. The memory device 1130 may include a nonvolatile memory device such as a flash memory device, a phase change memory device and/or a magnetic memory device. In addition, the memory device 1130 may further include a volatile memory device. In this case, the memory device 1130 may include a Static Random Access Memory (SRAM) device including a semiconductor device according to exemplary embodiments of the inventive concept. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for wired and/or wireless communication. Although not shown in the drawings, the electronic system 1100 may further include a fast DRAM device and/or a fast SRAM device that acts as a cache memory for improving an operation of the controller 1110. The semiconductor device according to exemplary embodiments of the inventive concept may be provided as a part of the controller 1110 and/or the I/O unit 1120.

Figure 18:
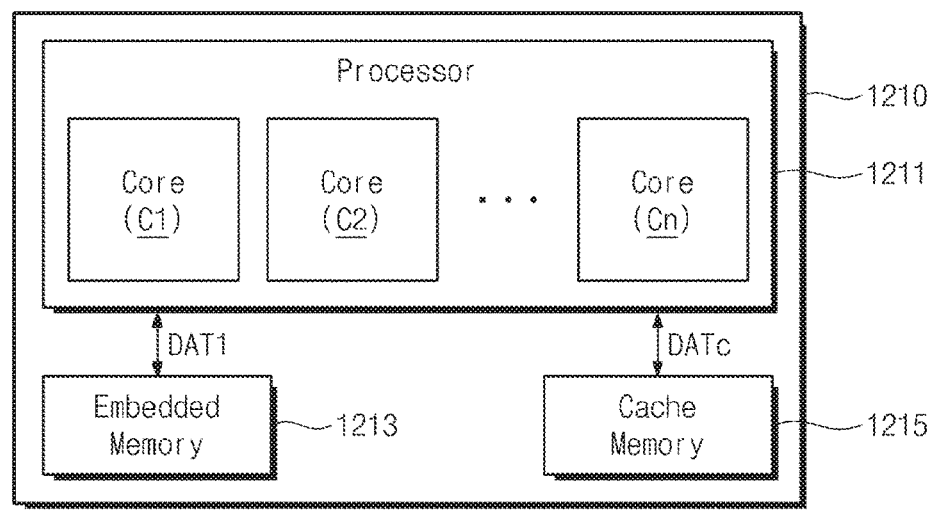
FIG. 18 is a block diagram showing the configuration of an electronic device including the semiconductor device according to exemplary embodiments of the inventive concept.

FIG. 18 is a block diagram showing the configuration of an electronic device including a semiconductor device according to exemplary embodiments of the inventive concept.

Referring to FIG. 18, the electronic device 1200 includes a semiconductor chip 1210. The semiconductor chip 1210 includes a processor 1211, an embedded memory 1213 and a cache memory 1215.

The processor 1211 may include one or more processor cores C1-Cn. The one or more processor cores C1-Cn may process a data and a signal. The processor cores C1-Cn may include a semiconductor device in accordance with embodiments of the inventive concept and for example, a plurality of logic cells illustrated with reference to FIG. 1.

The electronic device 1200 may perform a specific function using the processing data and the signal. The processor 1211 may be an application processor.

The embedded memory 1213 may exchange a first data DATA1 with the processor 1211. The first data DATA1 may be the data being processed or to be processed by the one or more processor cores C1-Cn. The embedded memory 1213 may manage the first data DATA1. For example, the embedded memory 1213 may buffer the first data DATA1. That is, the embedded memory 1213 may operate as a buffer memory or a working memory of the processor 1211.

According to an embodiment of the inventive concept, the electronic device 1200 may be applied to a wearable device.

The embedded memory 1213 may be an SRAM. The SRAM may operate at a faster speed than a Dynamic Random Access Memory (DRAM). When the SRAM is embedded in the semiconductor chip 1210, the electronic device 1200 may have a small size and may operate at a high speed. The SRAM may include the semiconductor device according to embodiments of the inventive concept.

The cache memory 1215 with the one or more processor cores C1 through Cn may be mounted on the semiconductor chip 1210. The cache memory 1215 may storage a cache data DATc. The cache data DATc may be data that is processed using the one or more processor cores C1 through Cn. The cache memory 1215 may include an SRAM including the semiconductor device according to embodiments of the inventive concept. For ease of understanding, in FIG. 18, the cache memory 1215 is shown as a separate component. However, the invention concept is not limited thereto. For example, the processor 1211 may be configured to include the cache memory 1215.

The processor 1211, the embedded memory 1213 and the cache memory 1215 may transmit data based on a variety of interface protocols. For example, the processor 1211, the embedded memory 1213 and the cache memory 1215 may transmit data based on at least one of Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), and Universal Flash Storage (UFS).

Figure 19:
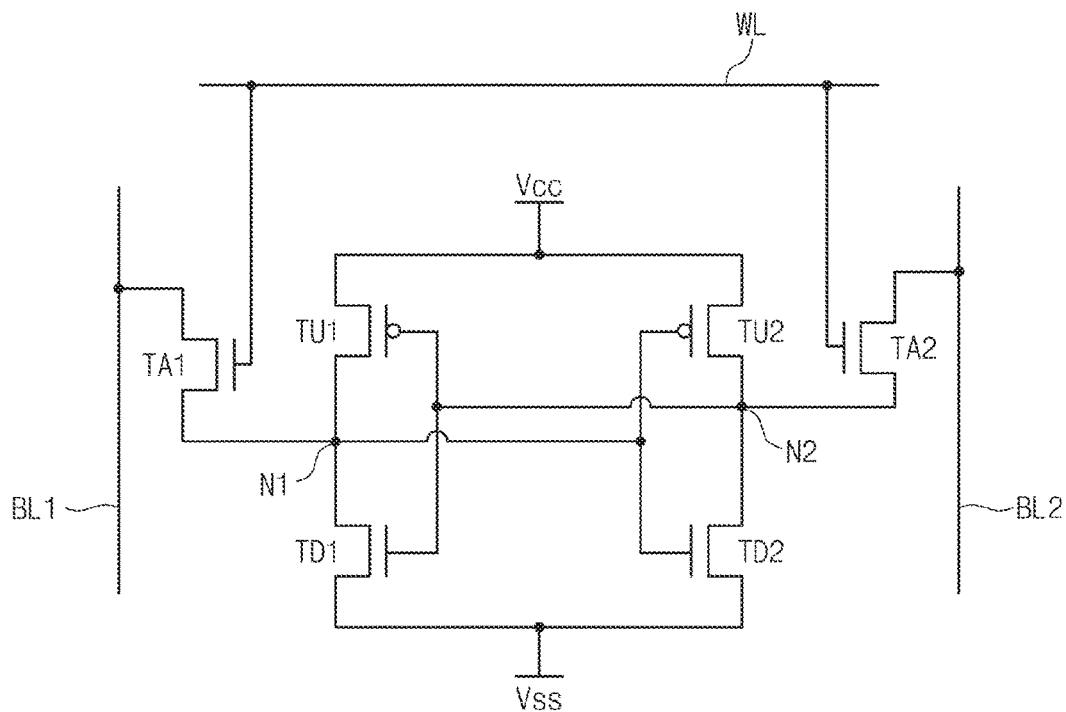
FIG. 19 is a circuit diagram of an SRAM cell according to exemplary embodiments of the inventive concept.

FIG. 19 is a circuit diagram of a SRAM cell according to exemplary embodiments of the inventive concept. The SRAM cell may be applied to the embedded memory 1213 and/or the cache memory 1215 illustrating in FIG. 18.

Referring to FIG. 19, the SRAM cell includes a first pull-up transistor TU1, a first pull-down transistor TD1, a second pull-up transistor TU2, a second pull-down transistor TD2, a first access transistor TA1 and a second access transistor TA2. The first and second pull-up transistors TU1 and TU2 are PMOS transistors, and the first and second pull-down transistors TD1 and TD2 are NMOS transistors.

A first source/drain of the first pull-up transistor TU1 and a first source/drain of the first pull-down transistor TD1 are connected to a first node N1. A second source/drain of the first pull-up transistor TU1 are connected to a power line Vcc and a second source/drain of the first pull-down transistor TD1 is connected to a ground line Vss. A gate of the first pull-up transistor TU1 and a gate of the first pull-down transistor TD1 are electrically connected to each other. Thus, the first pull-up transistor TU1 and the first pull-down transistor TD1 may constitute a first inverter. The gates of the first pull-up and pull down transistors TU1 and TD1 connected to each other may correspond to an input of the first inverter, and the first node may correspond to an output of the first inverter.

A first source/drain of the second pull-up transistor TU2 and a first source/drain of the second pull-down transistor TD2 may be connected to a second node N2. A second source/drain of the second pull-up transistor TU2 may be connected to a power line Vcc and a second source/drain of the second pull-down transistor TD2 may be connected to a ground line Vss. A gate of the second pull-up transistor TU2 and a gate of the second pull-down transistor TD2 may be electrically connected to each other. Thus, the second pull-up transistor TU2 and the second pull-down transistor TD2 may constitute a second inverter. The gates of the second pull-up and pull down transistors TU2 and TD2 connected to each other may correspond to an input of the second inverter, and the second node may correspond to an output of the second inverter.

The first and second inverters coupled to each other may constitute a latch structure. That is, the gates of the first pull-up and pull-down transistors TU1 and TD1 may be electrically connected to the second node N2, and the gates of the second pull-up and pull-down transistors TU2 and TD2 may be electrically connected to the first node N1. A first source/drain of the first access transistor TA1 may be connected to the first node N1, and a second source/drain of the first access transistor TA1 may be connected to a first bit line BL1. A first source/drain of the second access transistor TA2 may be connected to the second node N2, and a second source/drain of the second access transistor TA2 may be connected to a second bit line BL2. The gates of the first and second access transistors TA1 and TA2 may be connected to a word line WL. Thus, the SRAM cell in accordance with embodiments of the inventive concept may be implemented.

Figure 20:
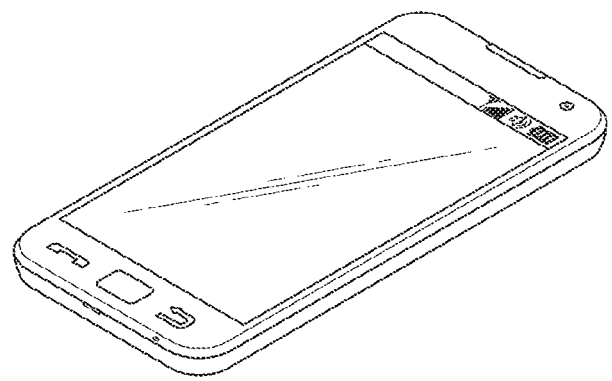
FIGS. 20 to 22 are perspective views illustrating multimedia devices including semiconductor devices according to exemplary embodiments of the inventive concept.
Figure 21:
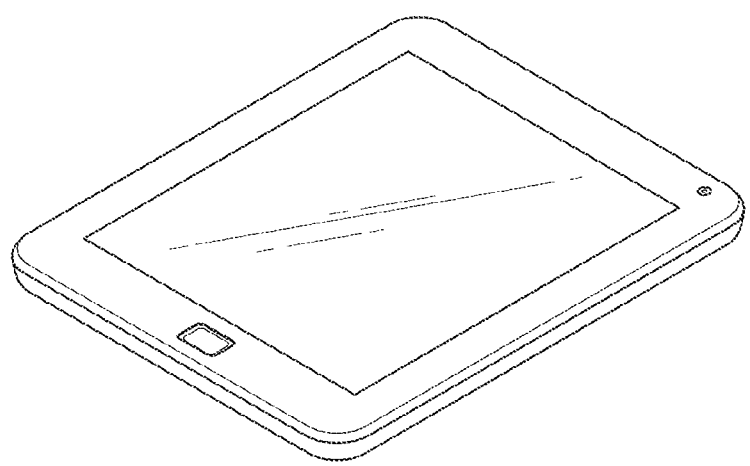
Figure 22:
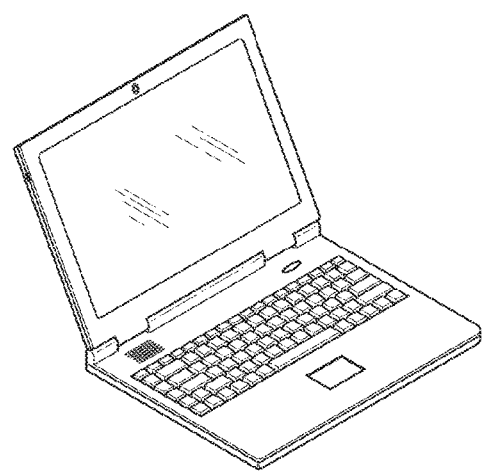

FIGS. 20 to 22 are drawings illustrating multimedia devices including semiconductor devices according to exemplary embodiments of the inventive concept. The electronic system 1100 of FIG. 17 and/or the electronic device 1200 of FIG. 18 may be applied to a mobile phone or a smart phone 2000 shown in FIG. 20, may be applied to a tablet or a smart tablet 3000 shown in FIG. 21, and may be applied to a notebook computer 4000 shown in FIG. 22.

Although the present inventive concept has been described in connection with the embodiments illustrated in the accompanying drawings, it is not limited thereto. It will be apparent to those skilled in the art that various substitutions, modification and changes may be made thereto without departing from the scope and spirit of the inventive concept.

What is claimed is:

1. A semiconductor device comprising:
   a substrate;
   an active pattern disposed on the substrate;
   a gate electrode crossing the active pattern;
   a gate dielectric layer disposed between the gate electrode and the active pattern;
   a capping structure disposed on the gate electrode; and
   gate spacers disposed on opposite sidewalls of the gate electrode,
   wherein the capping structure includes first and second capping patterns that are sequentially stacked on the gate electrode, and
   wherein the second capping pattern completely covers a top surface of the first capping pattern, and a dielectric constant of the second capping pattern is greater than that of the first capping pattern,
   wherein top surfaces of the gate spacers are coplanar with a top surface of the second capping pattern, and
   wherein the gate dielectric layer extends along opposite sidewalls of the gate electrode and contact a bottom surface of the first capping pattern.

2. The semiconductor device of claim 1, wherein sidewalls of the first and second capping patterns are coplanar with each other.

3. The semiconductor device of claim 1, wherein the first and second capping patterns have flat top surfaces.

4. The semiconductor device of claim 1, wherein a width of the first capping pattern is substantially the same as that of the second capping pattern.

5. The semiconductor device of claim 1, wherein the first capping pattern includes SiCN or SiOCN, and the second capping pattern includes SiN.

6. The semiconductor device of claim 1, further comprising:
   source and drain regions formed on the active pattern at both sides of the gate electrode; and
   contacts disposed at both sides of the gate electrode to be electrically connected to the source and drain regions.

7. The semiconductor device of claim 6, wherein the top surface of the second capping pattern is in contact with at least one of the contacts.

8. The semiconductor device of claim 1, further comprising:
a device isolation layer defining the active pattern on the substrate,
wherein an upper portion of the active pattern protrudes from a lower portion of the active pattern that is located between parts of the device isolation layer, and
wherein the gate electrode crosses the upper portion of the active pattern and extends on the device isolation layer.

9. The semiconductor device of claim 1,
wherein the active pattern extends in a first direction parallel to a top surface of the substrate,
wherein the gate electrode and the capping structure extend in a second direction crossing the first direction, and
wherein when viewed in a plan view, the gate electrode overlaps the capping structure.

10. The semiconductor device of claim 1, wherein the first capping pattern includes an internal air gap.

11. The semiconductor device of claim 10, wherein a lower width of the air gap is greater than an upper width of the air gap.

12. The semiconductor device of claim 10, wherein the air gap extends in a direction parallel to a top surface of the substrate along the gate electrode.

13. The semiconductor device of claim 1, further comprising a contact disposed at one side of the gate electrode to contact a source or a drain region, wherein the contact comprises a conductive pillar and a barrier layer surrounding the conductive pillar.

14. A semiconductor device comprising:
a substrate including an active pattern;
a gate electrode crossing the active pattern; and
a first capping pattern covering a top surface of the gate electrode,
wherein the first capping pattern includes an internal air gap, and a lower width of the air gap is greater than an upper width of the air gap.

15. The semiconductor device of claim 14, wherein when viewed in a plan view, the air gap is located at a center of the first capping pattern.

16. The semiconductor device of claim 14, further comprising:
a second capping pattern covering a top surface of the first capping pattern,
wherein a dielectric constant of the second capping pattern is greater than that of the first capping pattern.

17. The semiconductor device of claim 14, further comprising:
gate spacers on opposite sidewalls of the gate electrode,
wherein the gate spacers cover opposite sidewalls of the first and second capping patterns, and a top surface of the second capping pattern is coplanar with top surfaces of the gate spacers.

18. The semiconductor device of claim 14,
wherein the active pattern extends in a first direction parallel to a top surface of the substrate,
wherein the gate electrode and the first capping pattern extend in a second direction crossing the first direction, and
wherein the air gap which is located inside the first capping pattern, and extends in the second direction along the gate electrode.

19. A semiconductor device comprising:
a substrate including an active pattern;
a device isolation layer defining the active pattern;
a gate electrode crossing the active pattern; and
a first capping pattern covering a top surface of the gate electrode,
wherein an upper portion of the active pattern protrudes from a lower portion of the active pattern located between parts of the device isolation layer, and
wherein the first capping pattern includes an internal air gap having a first part with a first width and a second part with a second width, and
wherein the second part is closer to the substrate than the first part and the second width is larger than the first width.

* * * * *